(12) United States Patent
Okita

(10) Patent No.: US 6,987,045 B2
(45) Date of Patent: Jan. 17, 2006

(54) SEMICONDUCTOR DEVICE AND METHOD OF MANUFACTURING THE SAME

(75) Inventor: Yoichi Okita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 50 days.

(21) Appl. No.: 10/765,898

(22) Filed: Jan. 29, 2004

(65) Prior Publication Data

US 2004/0185663 A1 Sep. 23, 2004

Related U.S. Application Data

(62) Division of application No. 09/971,736, filed on Oct. 9, 2001, now Pat. No. 6,713,798.

(30) Foreign Application Priority Data

Apr. 26, 2001 (JP) .................................... 2001-129488

(51) Int. Cl.
H01L 21/8242 (2006.01)

(52) U.S. Cl. ...................................... 438/253; 438/396
(58) Field of Classification Search ................ 438/3, 438/253, 254, 396, 397, 398
See application file for complete search history.

(56) References Cited

U.S. PATENT DOCUMENTS 5,985,713 A   11/1999  Bailey
6,094,335 A   7/2000  Early
6,407,422 B1 * 6/2002  Asano et al. ................ 257/306
6,420,743 B1   7/2002  Hirano et al.

FOREIGN PATENT DOCUMENTS

JP          10-98162       4/1998

* cited by examiner

Primary Examiner—Hoai Pham
(74) Attorney, Agent, or Firm—Westerman, Hattori, Daniels & Adrian, LLP

(57) ABSTRACT

There are provided steps of forming sequentially a first conductive film, a dielectric film, and a second conductive film, that constitute a capacitor, on an insulating film, forming an upper electrode of the capacitor by etching the second conductive film while using a first resist pattern as a mask, removing the first resist pattern, forming second resist patterns, that have a width equal to or smaller than a pattern width of the upper electrode of the capacitor, on the upper electrode of the capacitor, and etching at least a part of the dielectric film and the first conductive film by using the second resist patterns as a mask, while exposing an upper surface of the upper electrode of the capacitor close to side portions by retreating side portions of the second resist patterns. Accordingly, a method of manufacturing a semiconductor device having a capacitor, that is capable of reducing a difference between a width of the upper electrode and a width of the lower electrode constituting the capacitor rather than the prior art, can be provided.

11 Claims, 23 Drawing Sheets

FIG. 1
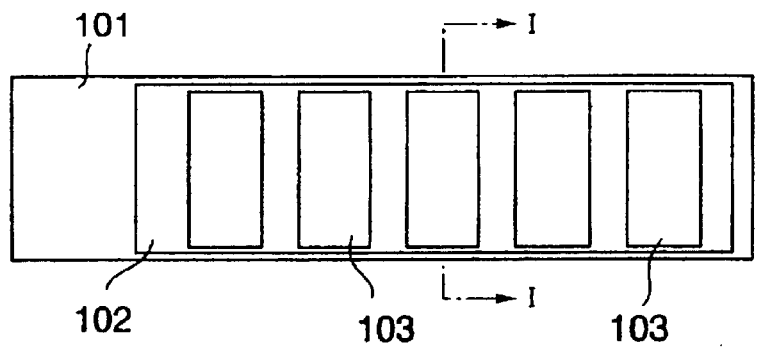
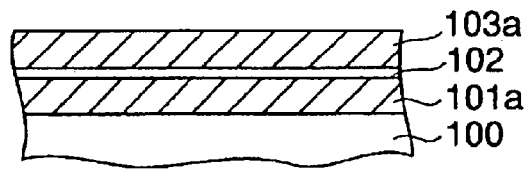
FIG. 2A
(Prior Art)
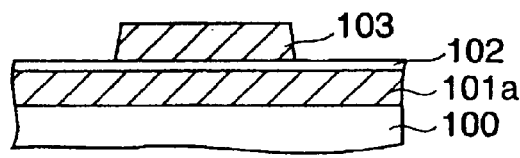
FIG. 2B
(Prior Art)
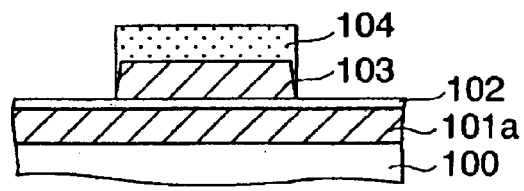
FIG. 2C
(Prior Art)
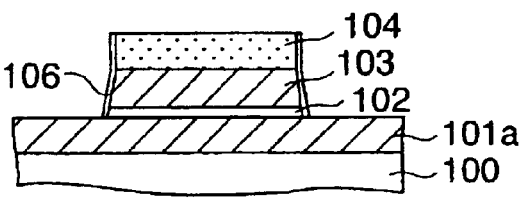
FIG. 2D
(Prior Art)
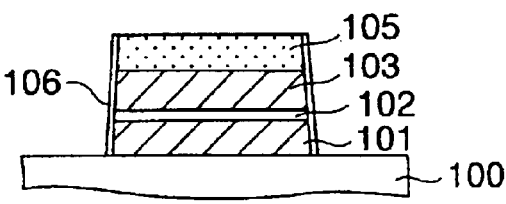
FIG. 2E
(Prior Art)

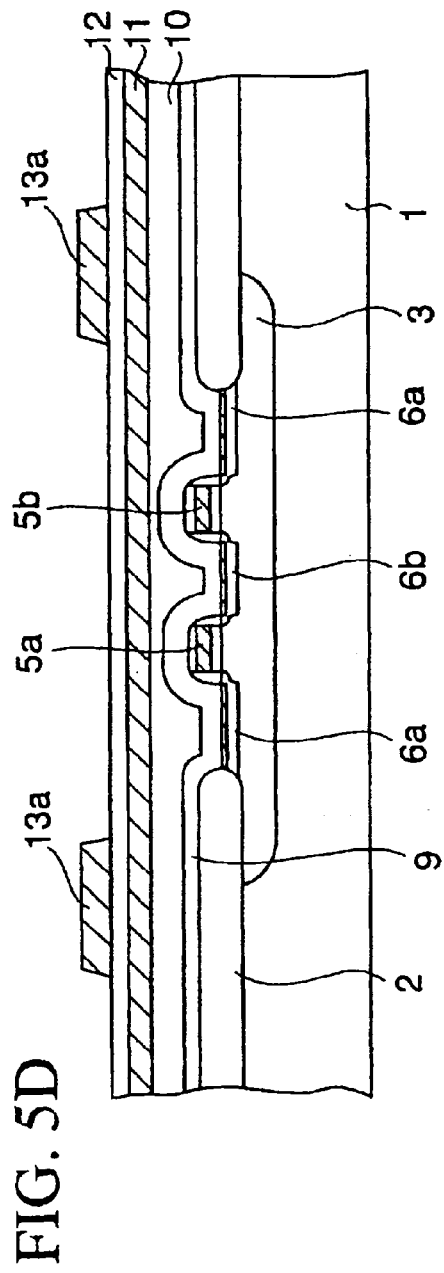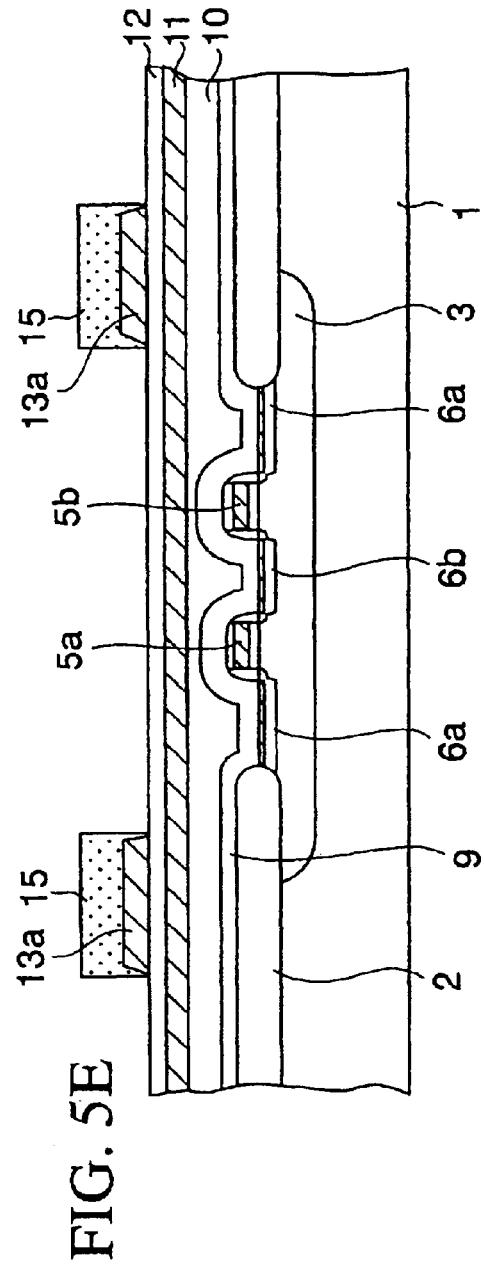

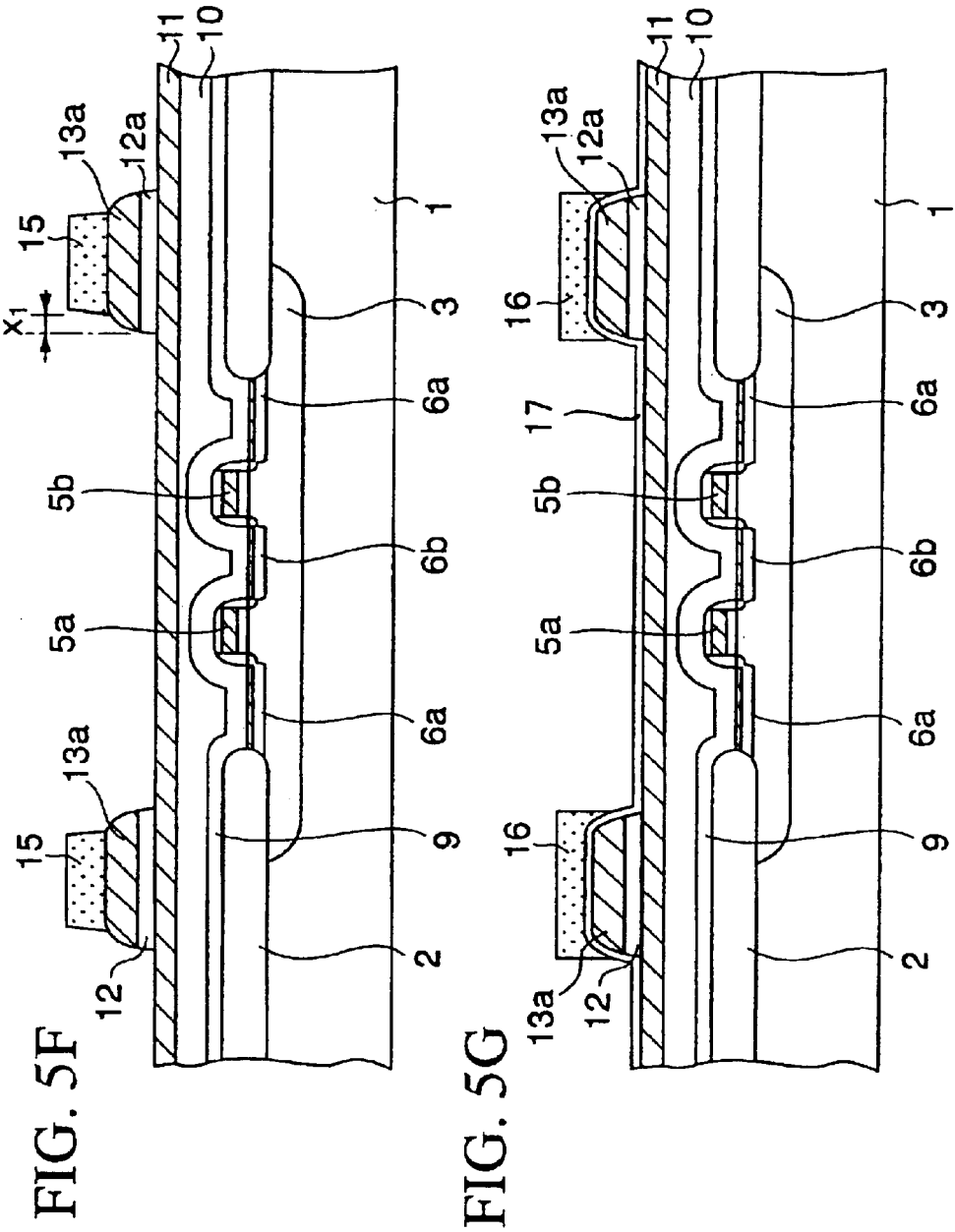

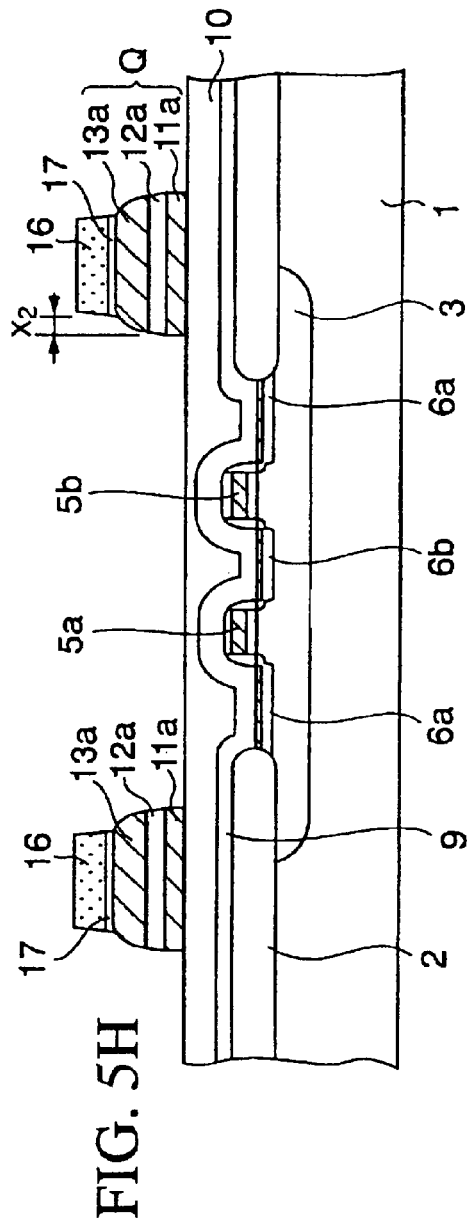
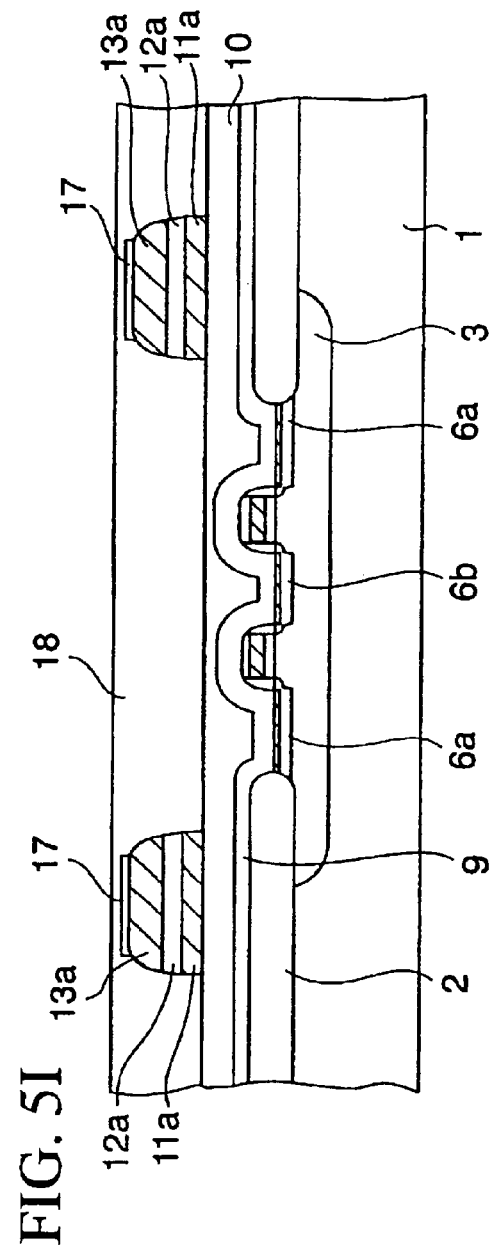

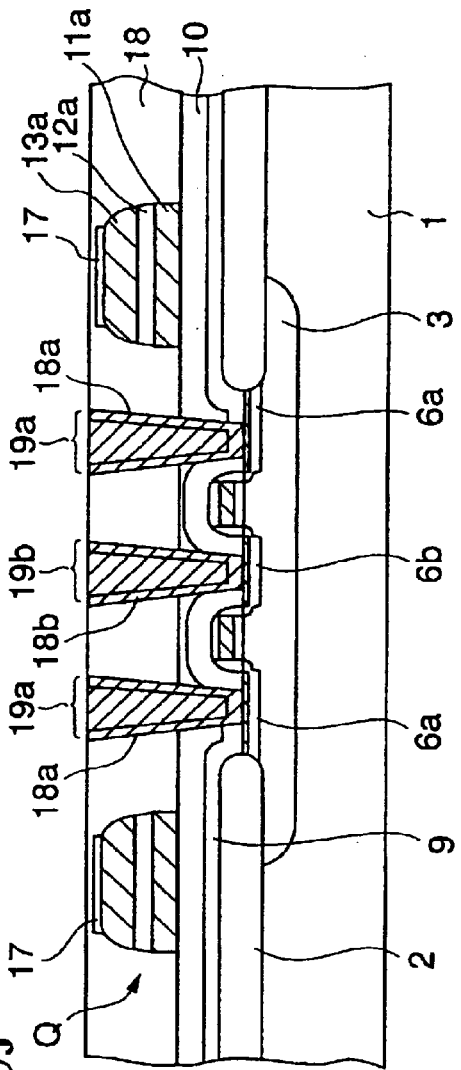
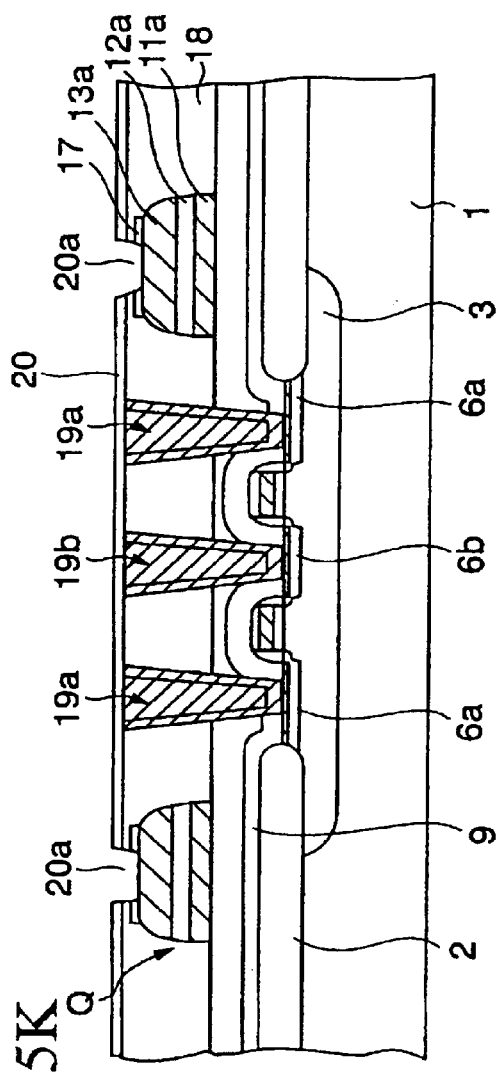
FIG. 5J
FIG. 5K

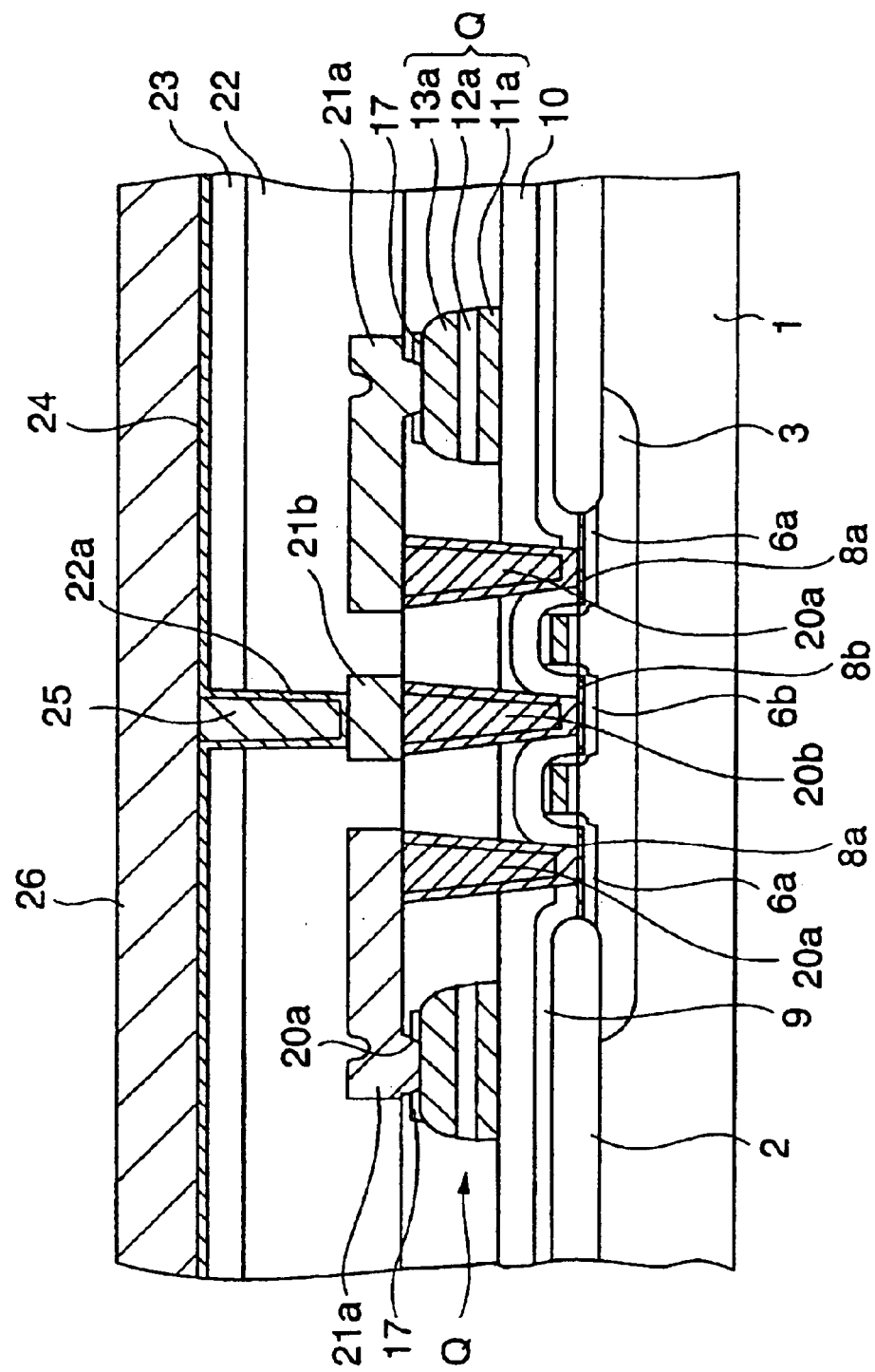

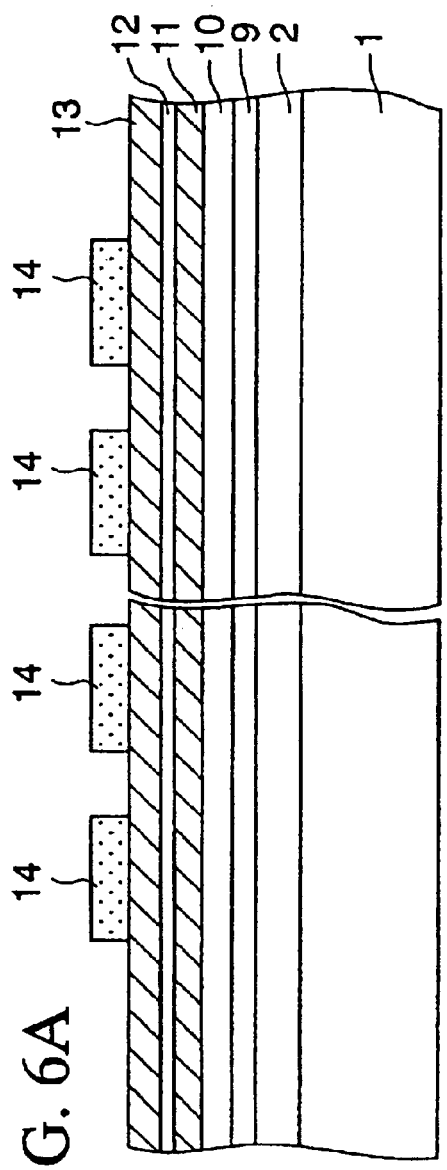
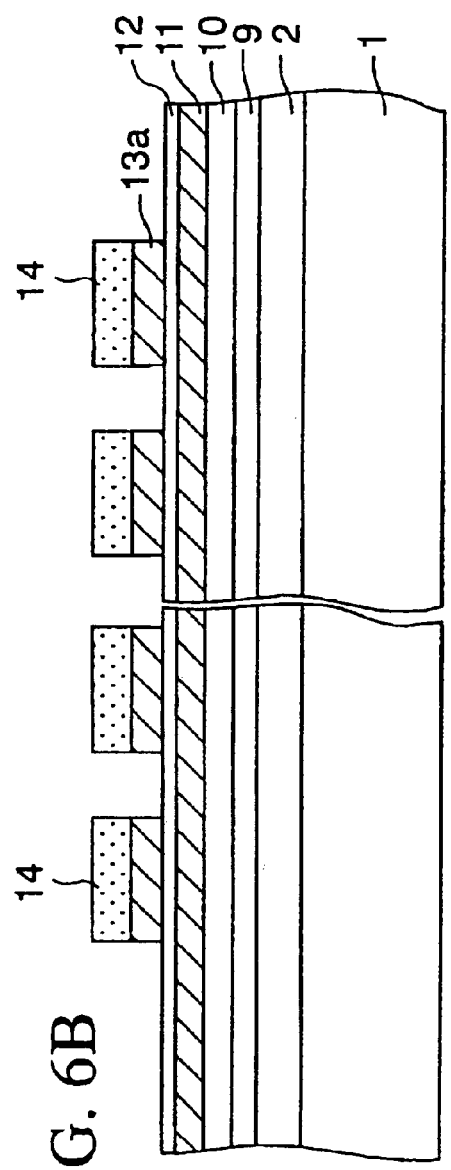
FIG. 6A
FIG. 6B

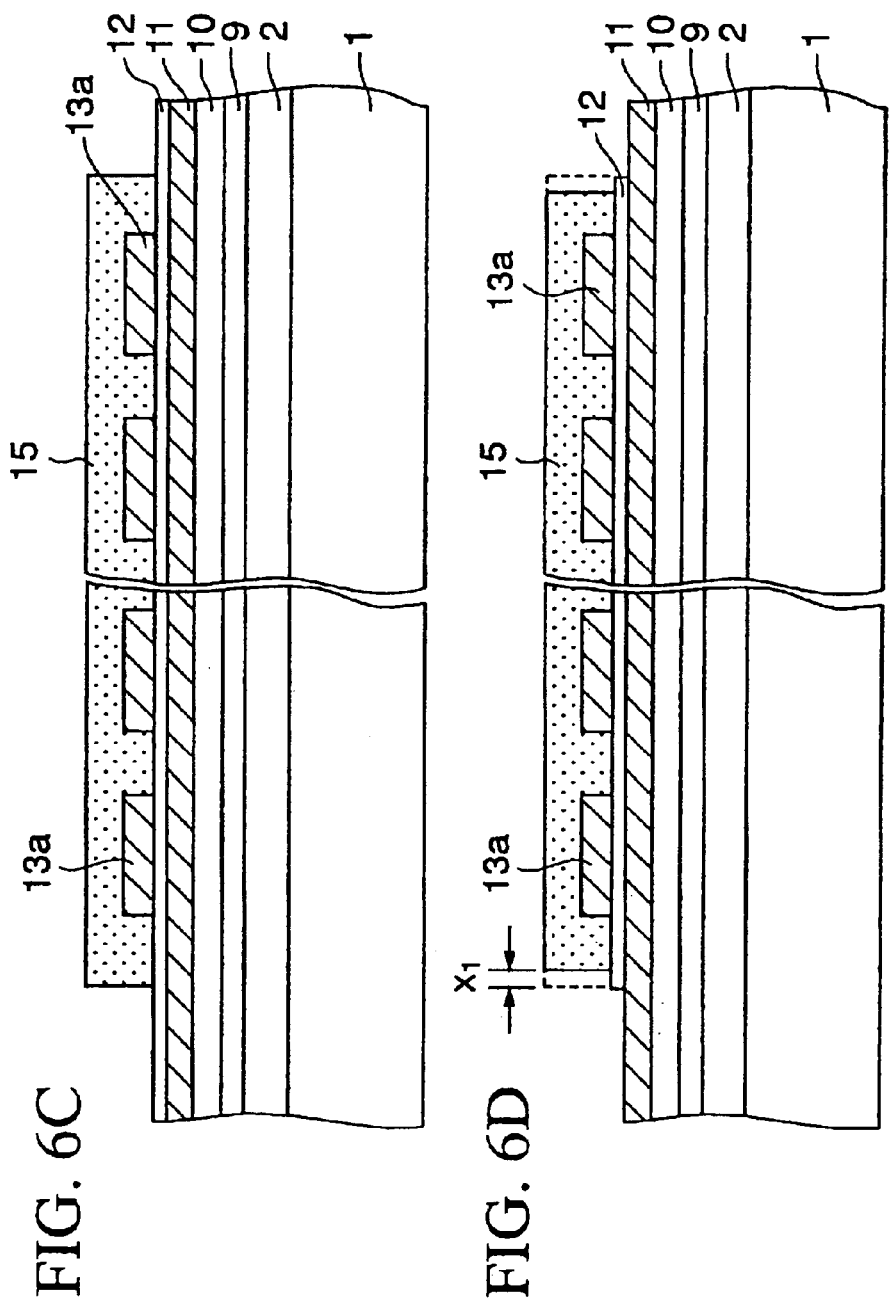

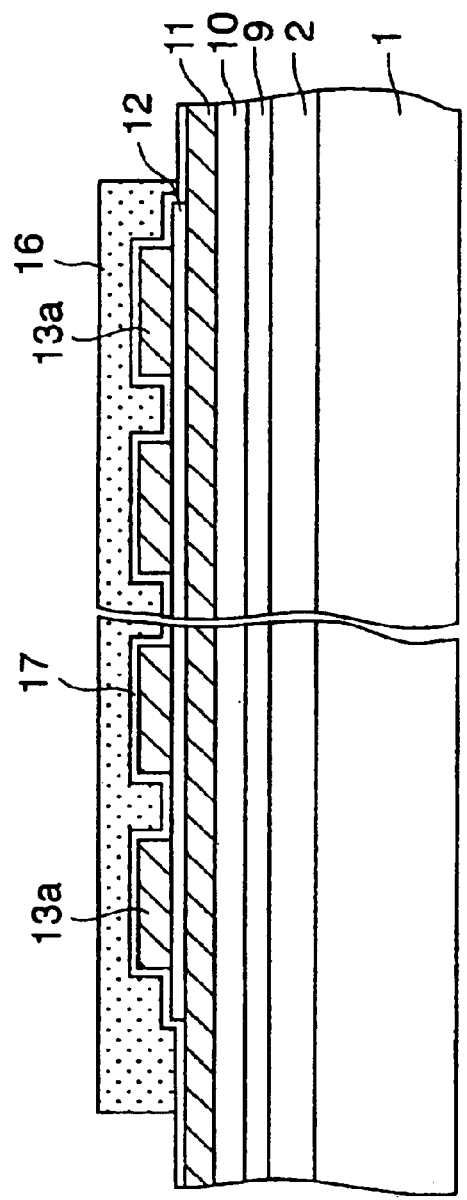
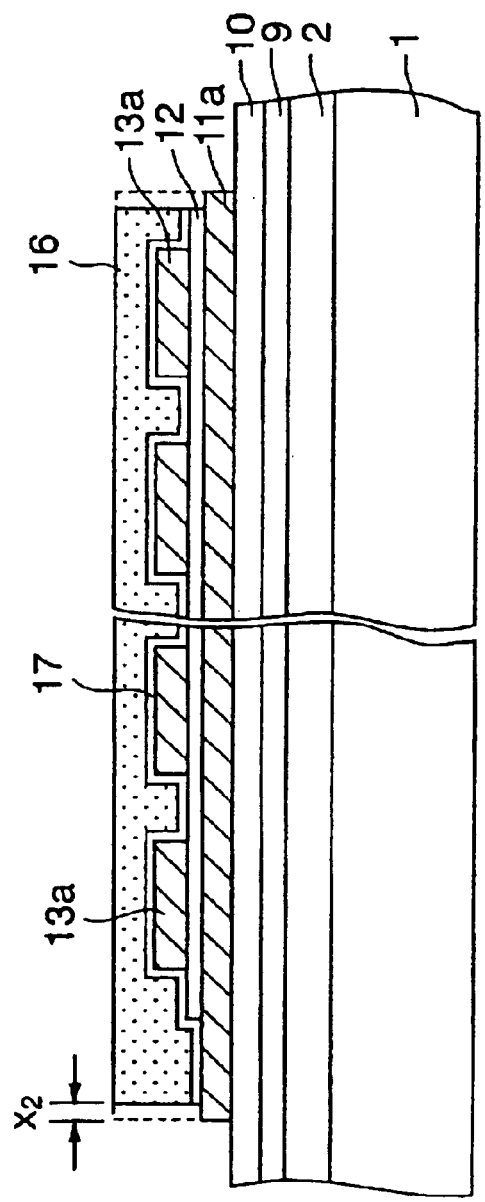

A: SHORT CIRCUIT VIA THE SIDE WALL ADHESIVE
B: NO SIDE WALL ADHESIVE

SEMICONDUCTOR DEVICE AND METHOD OF MANUFACTURING THE SAME

CROSS-REFERENCE TO RELATED APPLICATIONS

This application is a divisional of U.S. Ser. No. 09/971,736, filed Oct. 9, 2001 now U.S. Pat. No. 6,713,798 which is based upon and claims priority of Japanese Patent Application No. 2001-129488, filed in Apr. 26, 2001, the contents being incorporated herein by reference.

BACKGROUND OF THE INVENTION

1. Field of the Invention

The present invention relates to a semiconductor device and a method of manufacturing the same and, more particularly, a semiconductor device having a capacitor and a method of manufacturing the same.

2. Description of the Prior Art

As shown in FIG. 1, the capacitors constituting the planar FeRAM (Ferroelectric Random Access Memory) have a stripe-like lower electrode 101 called a plate line, a ferroelectric film 102 formed on the lower electrode 101, and a plurality of upper electrodes 103 formed on the ferroelectric film 102. Then, the capacitors are formed on the stripe-like lower electrode 101 as many as the upper electrodes 103.

Then, steps of forming the capacitor in the prior art, viewed from a I—I cross section in FIG. 1, will be explained hereunder.

First, as shown in FIG. 2A, a first conductive film 101a, a ferroelectric film 102, and a second conductive film 103a are formed sequentially on an insulating film 100. Then, a first resist pattern (not shown) having an upper electrode shape is formed on the second conductive film 103a, and then the second conductive film 103a is etched while using the first resist pattern as a mask. Then, as shown in FIG. 2B, the second conductive film 103a left after the first resist pattern is removed is employed as the upper electrode 103.

Then, as shown in FIG. 2C, a stripe-like second resist pattern 104 is formed on the ferroelectric film 102 to have a shape that coincides with both side edges of the upper electrode 103. Then, as shown in FIG. 2D, the ferroelectric film 102 is etched by using the second resist pattern 104 as a mask.

The second resist pattern 104 is removed, and then a stripe-like third resist pattern 105 is formed on the first conductive film 101a to have a shape that coincides with both side edges of the upper electrode 103 and the ferroelectric film 102. Then, as shown in FIG. 2E, the first conductive film 101a is etched by using the third resist pattern 105 as a mask, whereby the first conductive film 101a being left is employed as the lower electrode 101. After this, a planar shape shown in FIG. 1 can be obtained substantially by removing the third resist pattern 105.

As the material of the ferroelectric film 102 constituting such capacitor, PZT, PLZT, SBT, etc. are used. Also, as the material of the conductive films 101a, 103a, Pt, Ir, Ru, etc. are used. Since all materials have poor reactivity, the plasma etching having the strong sputter characteristic is employed mainly to pattern these films. In such etching process, as shown in FIGS. 2D and 2E, a product 106 is ready to adhere to the side wall of the pattern during the etching. The product 106 is conductive because it contains metal material. Thus, if the product 106 remains as it is, such product 106 causes the leakage current to flow between the upper and lower electrodes 103, 101 of the capacitor.

In other words, if the shape of the second resist pattern 104 or the third resist pattern 105 that is employed to pattern the ferroelectric film 102 or the lower electrode 101 is shaped to coincide with both side edges of the upper electrode 103, the conductive etching product 106 is adhered to the side wall of the capacitor. Therefore, such product 106 causes a short circuit between the upper electrode 103 and the lower electrode 101.

The fact that the reaction product is adhered to the side wall of the capacitor, that is patterned by using the resist as a mask, is also set forth in Patent Application Publication (KOKAI) Hei 10-98162.

In order to prevent the adhesion of the etching product onto the side wall of the capacitor, as shown in FIG. 3A or FIG. 3B, it is normal to form the second resist pattern 104 or the third resist pattern 105 wider than the width of the upper electrode 103 such that the etching product can be prevented from adhering onto the side wall of the overall capacitor.

The extended width of the second resist pattern 104 or the third resist pattern 105 from the upper electrode 103 must be set the length that is obtained by adding the margin to the displacement control range in the photolithography step.

Accordingly, the sectional shape of the capacitor is given as shown in FIG. 3C after the formation of the capacitor is completed. Thus, the side surface of the upper electrode 103 and the side surface of the lower electrode 101 are not positioned on the same plane and thus formed in tiers to have a level difference. A planar shape of the capacitor is shown in FIG. 4.

However, according to the capacitor forming method shown in FIGS. 3A to 3D, the short between the upper electrode and the lower electrode via the etching product can be prevented. In this case, the miniaturization of the capacitor is disturbed since, as shown in FIG. 4, the width of the lower electrode 101 must be formed larger than the upper electrode 103 by for example about 0.45 μm on one side because of the displacement of the exposure equipment and the marginal width.

SUMMARY OF THE INVENTION

It is an object of the present invention to provide a semiconductor device capable of reducing a difference between a width of an upper electrode constituting a capacitor and a width of a lower electrode constituting the capacitor smaller than that of the prior art and a method of manufacturing the same.

According to the present invention, when the dielectric film or the lower electrode constituting the capacitor is patterned by the etching and using the resist pattern, the side of the upper electrode is exposed by retreating the edge of the resist pattern during the etching, then the upper electrode of the capacitor and the resist pattern are used as the etching mask. The thickness of the upper electrode or the etching conditions is controlled or the material of the upper portion of the upper electrode is constituted so that the planar shape of the upper electrode is seldom changed at a point of time when the etching of the film serving as the dielectric film or the lower electrode is finished.

Therefore, since the conductive product generated at the time of etching does not adhere onto the side surface of the capacitor, the short between the upper electrode and the lower electrode via the conductive product is prevented in advance. Also, the improvement of the cell efficiency is achieved by suppressing the reduction in the width of the upper electrode from the width of the lower electrode to the lowest minimum.

Also, according to the present invention, not only the retreat of the resist pattern but also the retreat of the upper electrode is executed when the dielectric film or the lower electrode film is etched. Therefore, the reduction of the area of the capacitor due to the rounded corners of the resist pattern is hard to occur.

In addition, according to the present invention, the both sides of the upper electrode are exposed from the resist pattern, and both sides of the upper electrode are removed when the dielectric film or the lower electrode film is patterned by etching. Therefore, the variation in the area of the upper electrode due to the displacement of the resist pattern can be suppressed.

BRIEF DESCRIPTION OF THE DRAWINGS

FIG. 1 is a plan view showing a shape of an ideal capacitor in the FeRAM;

FIGS. 2A to 2E are sectional views showing first capacitor forming steps in the prior art;

FIGS. 5A to 5L are sectional views showing steps of manufacturing a semiconductor device according to a first embodiment of the present invention;

FIGS. 6A to 6F are sectional views, taken along a II—II line in FIG. 6A, showing steps of manufacturing the semiconductor device according to the first embodiment of the present invention;

DESCRIPTION OF THE PREFERRED EMBODIMENTS

Embodiments of the present invention will be explained with reference to the accompanying drawings hereinafter.

(First Embodiment)

FIGS. 5A to 5L are sectional views showing steps of manufacturing a semiconductor device according to a first embodiment of the present invention. FIGS. 6A to 6F are sectional views showing steps of forming a capacitor in the semiconductor device according to the first embodiment of the present invention in the word line direction. FIGS. 7A to 7I are plan views showing steps of forming a memory cell of the semiconductor device according to the first embodiment of the present invention.

Figure 5A:
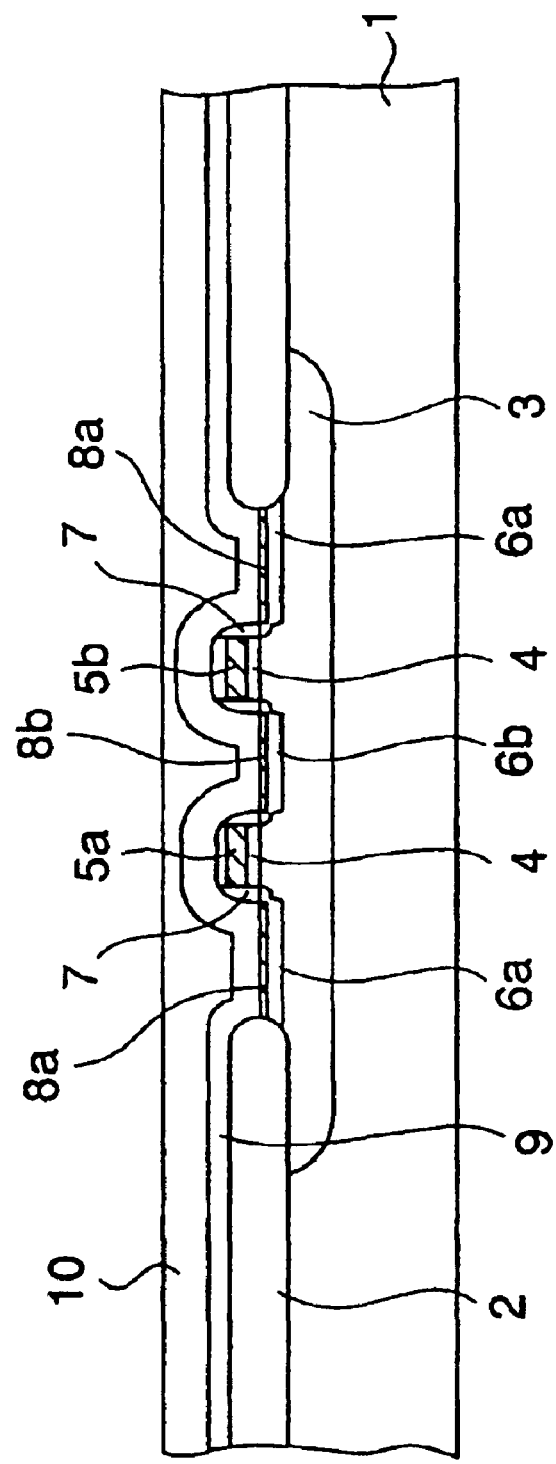

First, steps required to get a sectional structure shown in FIG. 5A will be explained hereunder.

A device isolation insulating film 2 is formed on a surface of an n-type or p-type silicon (semiconductor) substrate 1 by the LOCOS (Local Oxidation of Silicon) method. STI (Shallow Trench Isolation) may be employed as the device isolation insulating film 2.

After such device isolation insulating film 2 is formed, a p-well 3 is formed in a predetermined active region (transistor forming region) in the memory cell region of the silicon substrate 1.

Then, a silicon oxide film is formed by thermally oxidizing a surface of the active region of the silicon substrate 1. This silicon oxide film is used as a gate insulating film 4.

Then, a conductive film made of polysilicon or refractory metal silicide is formed on an overall upper surface of the silicon substrate 1. Then, gate electrodes 5a, 5b are formed by patterning the conductive film into a predetermined shape by virtue of the photolithography method. Two gate electrodes 5a, 5b are arranged in almost parallel on the p-well 3 in the memory cell region. These gate electrodes 5a, 5b constitute a part of the word line.

Then, n-type impurity diffusion regions 6a, 6b serving as source/drain of an n-channel MOS transistor are formed by ion-implanting the n-type impurity into the p-well 3 on both sides of the gate electrodes 5a, 5b. Then, an insulating film is formed on the overall surface of the silicon substrate 1, and then the insulating film is etched back to be left on both sides of the gate electrodes 5a, 5b as sidewall insulating films 7. The insulating film is a silicon oxide ($SiO_2$) film formed by the CVD method, for example.

Then, the n-type impurity diffusion regions 6a, 6b are formed as the LDD structure by implanting the n-type impurity ion again in the p-well 3 while using the gate electrodes 5a, 5b and the sidewall insulating films 7 as a mask. In one p-well 3, the n-type impurity diffusion region 6b put between two gate electrodes 5a, 5b is connected electrically to the bit line described later, and two n-type impurity diffusion regions 6a formed on both sides of the p-well 3 is connected electrically to an upper electrode of the capacitor described later.

Figure 7A:
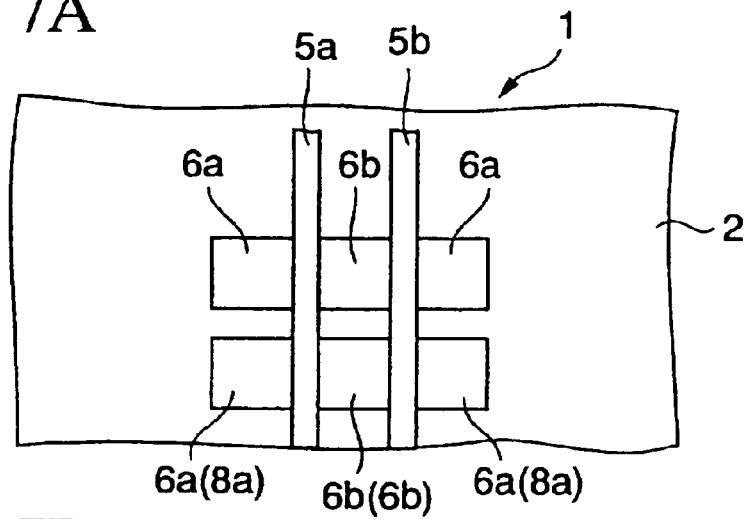
FIGS. 7A to 7I are plan views showing steps of forming a memory cell of the semiconductor device according to the first embodiment of the present invention.
Figure 7B:
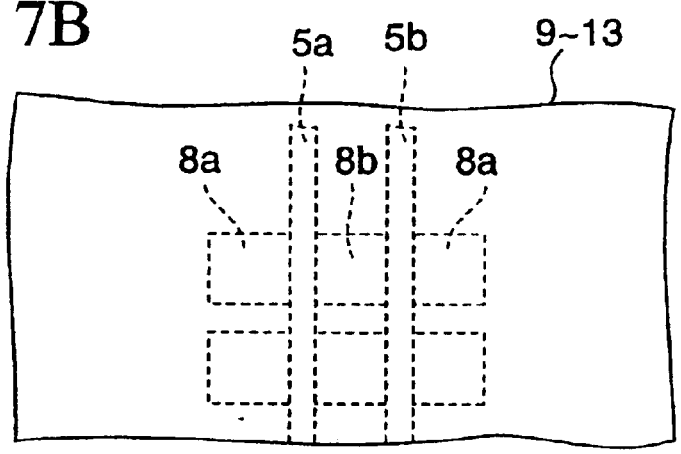

As described above, two n-type MOSFETs are constructed by the gate electrodes 5a, 5b, the n-type impurity diffusion regions 6a, 6b, etc. in the p-well 3. A planar structure of the memory cell is shown in FIG. 7A. In this case, the sidewall insulating films 7 are omitted in this plan view.

Then, a refractory metal film is formed on the overall surface, and then refractory metal silicide layers 8a, 8b are formed on surfaces of the n-type impurity diffusion regions 6a, 6b respectively by heating this refractory metal film. Then, the unreacted refractory metal film is removed by the wet etching.

Then, a silicon oxide nitride (SiON) film of about 200 nm thickness is formed on the entire surface of the silicon substrate 1 by the plasma CVD method as a cover film 9. Then, silicon dioxide ($SiO_2$) is grown on the cover film 9 as a first interlayer insulating film 10 by the plasma CVD method using the TEOS gas to have a thickness of about 1.0 $\mu$m. In turn, the first interlayer insulating film 10 is polished by the CMP (Chemical Mechanical Polishing) method to planarize its upper surface.

Figure 5B:
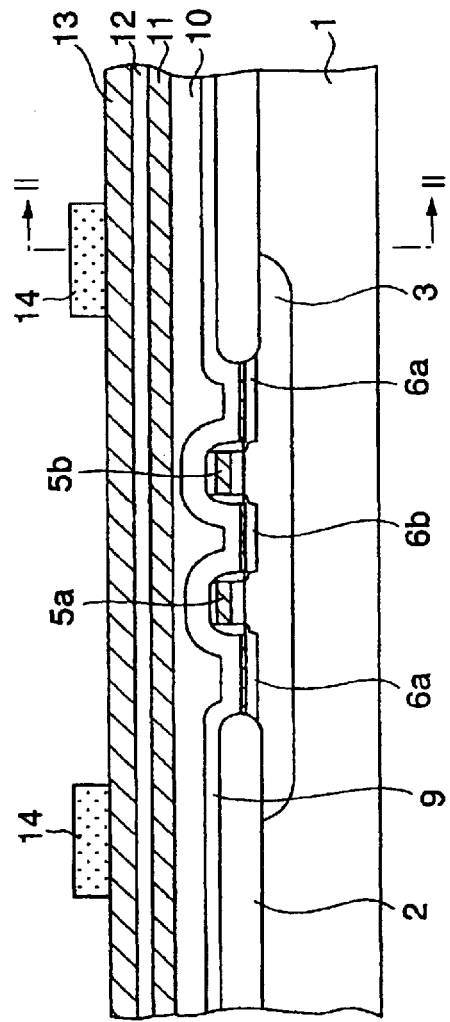

Next, steps required to form a structure shown in FIG. 5B, FIG. 6A will be explained hereunder.

First, a platinum (Pt) film of 100 to 300 nm thickness is formed on the first interlayer insulating film 10 by the DC sputter method. This platinum film is used as a first conductive film 11. In order to improve the adhesion between the platinum film and the first interlayer insulating film 10, a titanium film of 10 to 30 nm thickness may be formed between them. In this case, as the first conductive film 11, a film made of iridium, ruthenium, ruthenium oxide, strontium ruthenium oxide ($SrRuO_3$), etc. may be formed.

Then, PZT ($Pb(Zr_{1-x}Ti_x)O_3$) is formed on the first conductive film 11 by the sputtering method to have a thickness of 100 to 300 nm. This PZT film is used as a ferroelectric film 12.

Then, the silicon substrate 1 is placed in the oxygen atmosphere. Then, the RTA (Rapid Thermal Annealing) process is applied to the PLZT (Plumbum Lanthanum Zirconate Titanate) film constituting the ferroelectric film 12 at the temperature of 725° C. and the temperature-rising rate of 125° C./sec for 20 seconds, for example. Thus, the crystallizing process of the PZT film is carried out.

As the method of forming the ferroelectric film 12, there are the spin-on method, the sol-gel method, the MOD (Metal Organic Deposition) method, and the MOCVD method in addition to the above sputter method. Also, as the material of the ferroelectric film 12, there are bismuthate compound such as PLZT (($Pb_{1-x}La_x)(Zr_{1-y}Ti_y)O_3$) $SrBi_2(Ta_xNb_{1-x})_2O_9$ (0<x≦1), $Bi_4Ti_2O_{12}$, etc. in addition to PZT.

After such ferroelectric film 12 is formed, an iridium oxide ($IrO_x$) film of 150 to 250 nm thickness is formed thereon as a second conductive film 13 by the sputtering method. That is, the thickness of the second conductive film 13 is set to such a value that the film still remains by at least more than 20 nm at its side edge portions in the state that the patterning of the second conductive film 13, the ferroelectric film 12, and the first conductive film 11 is finished. In this case, as the second conductive film 13, a platinum film or a strontium ruthenium oxide (SRO) film may be formed by the sputter method. The memory cell in which the second conductive film 13 is formed has a planar structure shown in FIG. 7B.

Then, resist is coated on the second conductive film 13 and then first resist patterns 14 each having a shape of an upper electrode are formed by exposing/developing this resist.

Figure 5C:
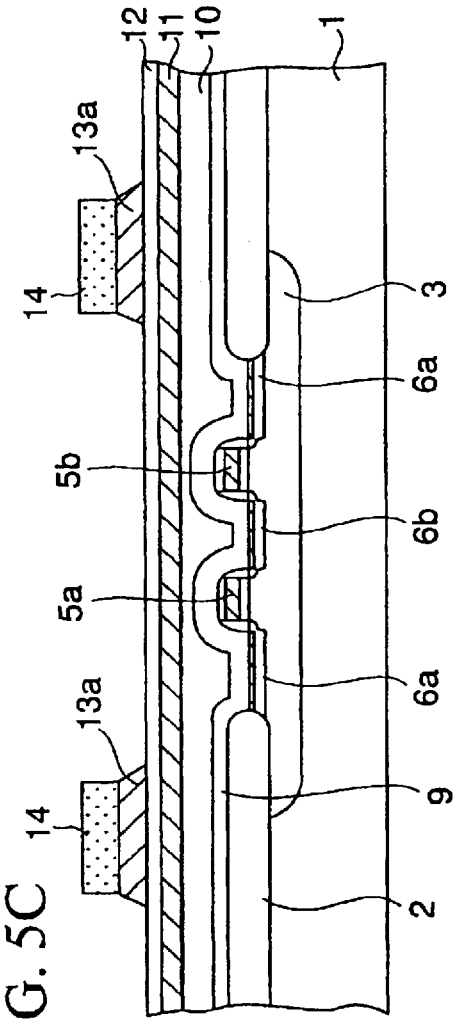
Figure 7C:
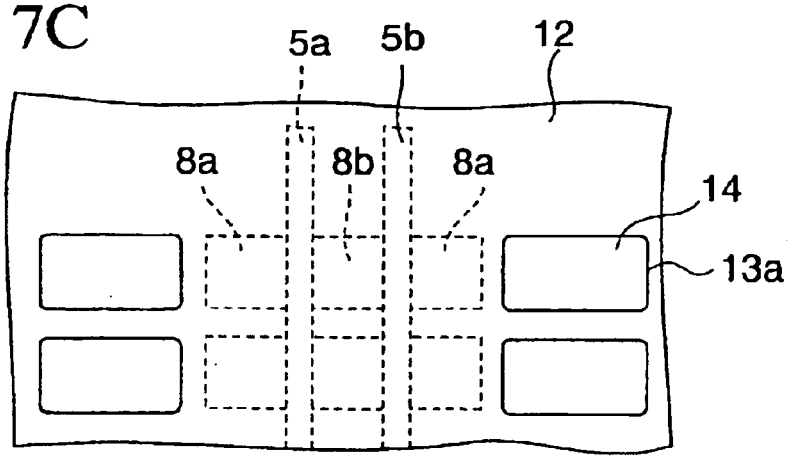

Then, as shown in FIG. 5C, FIG. 6B, and FIG. 7C, the second conductive film 13 is etched by using the first resist patterns 14 as a mask, whereby the second conductive film 13 being left is used as an upper electrode 13a of the capacitor.

Then, as shown in FIG. 5D, the upper electrodes 13a of the capacitor are exposed by removing the first resist patterns 14.

After this, the ferroelectric film 12 is annealed via the upper electrodes 13a of the capacitor in the oxygen atmosphere at the temperature of 650° C. for 60 minutes. This annealing is carried out to recover the damage applied to the ferroelectric film 12 in the sputtering and the etching.

Figure 7D:
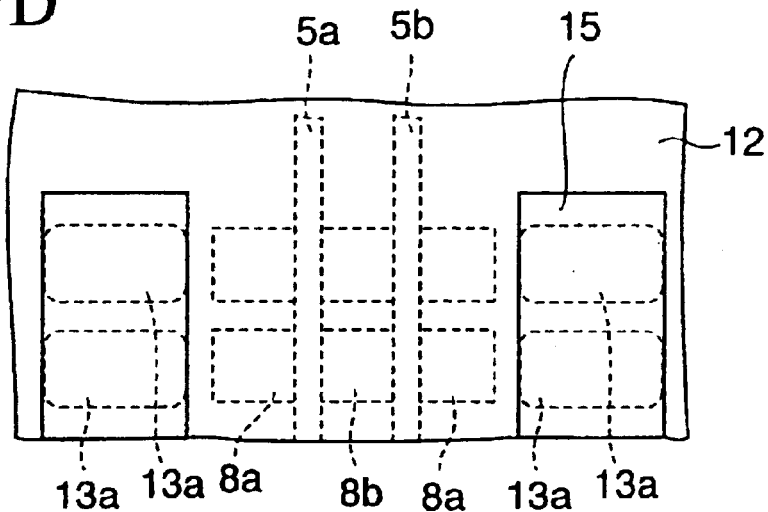

Then, as shown in FIG. 5E, FIG. 6C, and FIG. 7D, second resist patterns 15 are formed by coating the resist on the upper electrodes 13a of the capacitor and the ferroelectric film 12 and then exposing/developing this resist. The second resist patterns 15 have stripe shapes passing over a plurality of upper electrodes 13a of the capacitor, which are aligned in the extended direction of the gate electrodes 5a, 5b, and also have a width equivalent to that of the upper electrode 13a of the capacitor respectively.

Figure 7E:
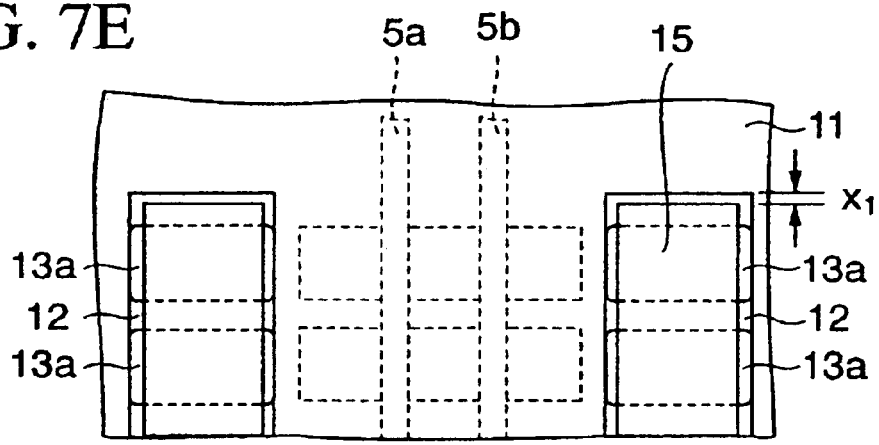

Then, as shown in FIG. 5F, FIG. 6D, and FIG. 7E, the ferroelectric film 12 is etched by using the second resist patterns 15 as a mask. At this time, the adhesion of the by-product onto the side wall of the capacitor should be prevented by setting the etching conditions that is able to retreat appropriately the second resist patterns 15. An amount of retreat $x_1$ of the second resist patterns 15 on one side at this time is almost 0.4 $\mu$m. The control of the amount of retreat of the resist is executed by adding a gas that has reactivity to the resist, e.g., a chlorine ($Cl_2$) gas, etc. into the process gas or adjusting the pressure or the bias power. The details will be described later.

During the etching of the ferroelectric film 12, the second resist patterns 15 is retreated to expose peripheral edge portions on both sides of the upper electrodes 13a, and then upper portions near the both ends of the upper electrodes 13a of the capacitor are etched. In this case, the exposed portion functions as a mask for the ferroelectric film 12, and both sides of the upper electrodes 13a of the capacitor remain to have a thickness that can satisfy sufficiently the masking property at a point of time when the etching of the ferroelectric film 12 is finished. In order to make the upper electrodes 13a of the capacitor have the masking property sufficiently, the material, the film thickness, or the selective etching ratio of the first conductive film 13 is set.

The upper electrodes 13a of the capacitor are covered with the second resist patterns 15 wider than the amount of retreat in the extending direction of the stripe-like ferroelectric film 12. Therefore, as shown in FIG. 7E, the film thickness is not changed except four corners of the upper electrodes 13a of the capacitor.

As a result, after the patterning of the ferroelectric film 12 is finished, the film thickness of the upper electrodes 13a of the capacitor distributes such that the film thickness is thick in the center portion of the area that is covered with the second resist patterns 15 to the end and is thin on both side portions of the area.

Figure 7F:
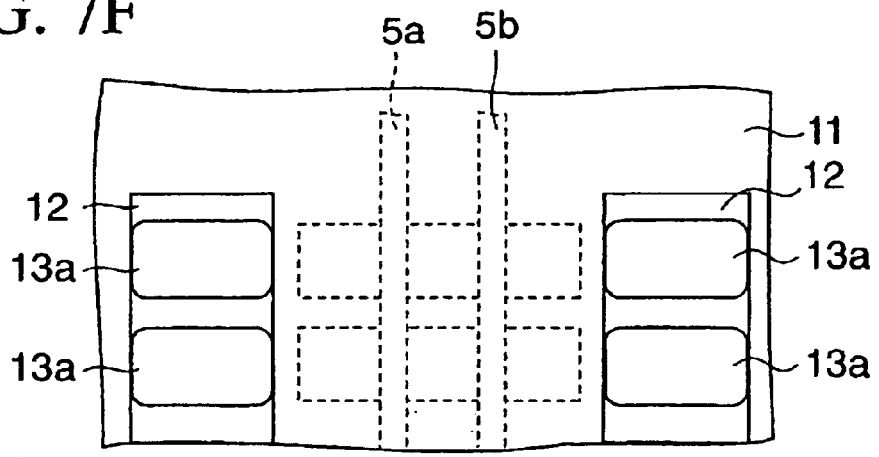

The ferroelectric film 12 that is patterned like a stripe while using the upper electrodes 13a of the capacitor as a part of a mask is used as a dielectric film 12a of the capacitor. Then, the second resist patterns 15 is removed, and then the dielectric film 12a of the capacitor is annealed in the oxygen atmosphere at the temperature of 650° C. for 60 minutes. A planar state obtained after the second resist patterns 15 are removed is shown in FIG. 7F.

Figure 7G:
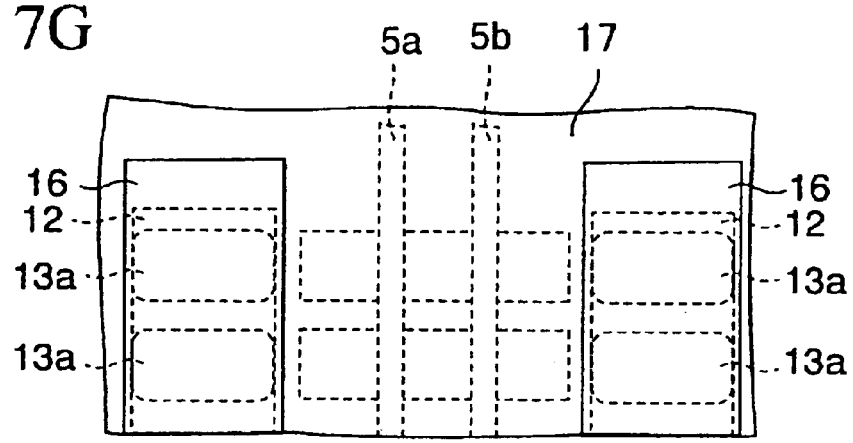
Figure 7H:
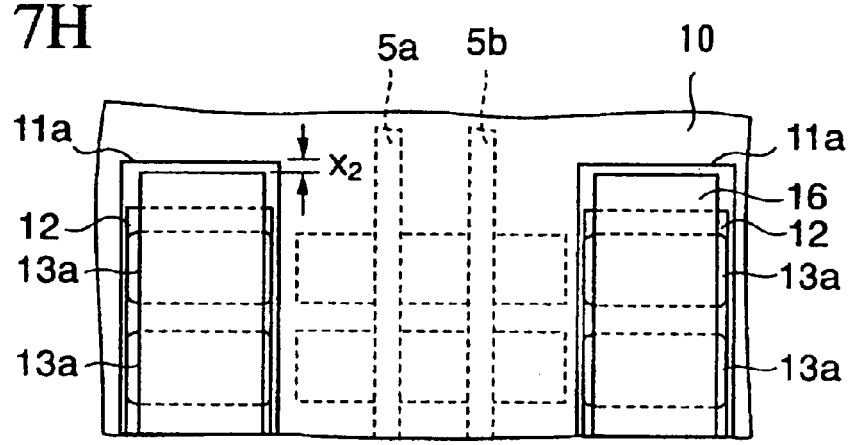
Figure 7I:
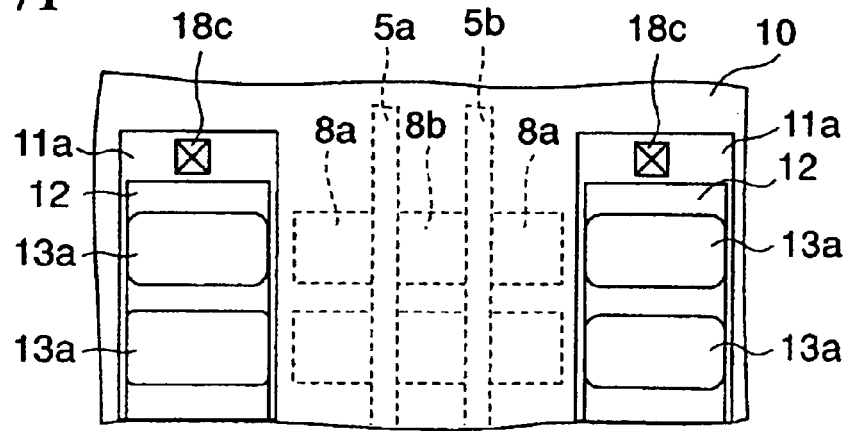

Then, as shown in FIG. 5G, FIG. 6E, and FIG. 7G, an $Al_2O_3$ film of 50 nm thickness is formed as an encap layer 14 on the upper electrodes 13a of the capacitor, the dielectric films 12a of the capacitor, and the first conductive film 11 by the sputtering method at the normal temperature. This encap layer 17 is formed to protect the dielectric films 12a of the capacitor, which are ready to be reduced, from the hydrogen. As the encap layer 17, a PZT film, a PLZT film, or a titanium oxide film may be formed. In FIGS. 7G to 7I, this encap layer 17 is omitted.

Then, the film quality is improved by applying the RTA process to the dielectric films 12a of the capacitor under the encap layer 17 in the oxygen atmosphere at the temperature of 700° C. and the temperature-rising rate of 125° C./sec for 60 seconds.

Then, third resist patterns 16 are formed on the dielectric films 12a of the capacitor by coating the resist on the encap layer 17 and then exposing/developing this resist. The third resist patterns 16 have stripe shapes that are longer than the dielectric films 12a and also have a width equivalent to that of the upper electrode 13a of the capacitor respectively.

Then, as shown in FIG. 5H, FIG. 6F, and FIG. 7H, the first conductive film 11 and the encap layer 17 are etched by using the third resist patterns 16 as a mask, and accordingly the stripe-like first conductive films 11 left under third resist patterns 16 are used as lower electrodes 11a of the capacitor. The lower electrode 11a of the capacitor is also called a plate line.

At the time of etching, the adhesion of the etching product onto the capacitor side wall can be prevented by setting the etching conditions to retreat appropriately the third resist patterns 16. An amount of retreat $x_2$ of the third resist patterns 16 on one side at this time is about 0.4 μm. The amount of retreat of the resist can be controlled by adding a gas that has the reactivity to the resist, e.g., the chlorine ($Cl_2$) gas, or the like, into the process gas or adjusting the pressure or the bias power. The details will be described later.

The third resist patterns 16 are retreated during the etching of the first conductive film 11 and the encap layer 17, and then upper portions of the upper electrodes 13a of the capacitor on both sides are exposed and etched. In this case, since the exposed portion functions as a mask, the upper electrodes 13a of the capacitor are left to have the thickness having the masking property sufficiently at a point of time when the etching of the first conductive film 11 is finished.

The thickness that is enough to function as the upper electrode 13a of the capacitor must be assured as the thickness of the upper electrode 13a of the capacitor left at a point of time when the formation of the first conductive film 11 is finished. The performance of the ferroelectric capacitor is largely affected by the crystal state close to the boundary between the ferroelectric film 12 and the upper electrode 13a of the capacitor. That is, even when the film of the upper electrode 13a of the capacitor is reduced in thickness, the capacitor is not largely influenced if the layer that is close to the boundary and decides the capacitor performance is assured. In the case that a PZT film is employed as the ferroelectric film 12 and an iridium oxide film is employed as the upper electrode 13a of the capacitor, the upper electrode 13a of the capacitor must be left finally on both sides to have a thickness of more than 20 nm if preservation of the good crystallinity of the layer close to the boundary is taken into consideration.

A planar structure on the first interlayer insulating film 10 after the third resist patterns 16 are removed is shown in FIG. 7I. A plurality of upper electrodes 13a of the capacitor are formed on one stripe-like dielectric film 12a of the capacitor, and the lower electrodes 11a of the capacitor under the dielectric film 12a of the capacitor are formed longer than the dielectric film 12a of the capacitor. Accordingly, the ferroelectric capacitors Q each consisting of the lower electrode 11a, the dielectric film 12a, and the upper electrode 13a are formed on the first interlayer insulating film 10 as many as the upper electrodes 13a of the capacitor.

Then, the dielectric films 12a of the capacitor are annealed at the temperature of 650° C. for 60 minutes in the oxygen atmosphere and thus recovered from the damage.

Then, as shown in FIG. 5I, an $SiO_2$ film of 1200 nm thickness is formed as a second interlayer insulating film 18 on the ferroelectric capacitors Q and the first interlayer insulating film 10 by the CVD method, and then a surface of the second interlayer insulating film 18 is planarized by the CMP method. The growth of the second interlayer insulating film 18 may be carried out by employing either silane ($SiH_4$) or TEOS as the reaction gas. Planarization of the surface of the second interlayer insulating film 18 is continued to get a thickness of 200 nm from the upper surface of the upper electrode 13a of the capacitor.

Next, steps required to form a structure shown in FIG. 5J will be explained hereunder.

First, contact holes 18a, 18b, 18c are formed on the n-type impurity diffusion regions 6a, 6b, and the lower electrodes 11a of the capacitor by patterning the first interlayer insulating film 10, the second interlayer insulating film 18, and the cover film 9 respectively. The CF gas, for example, the mixed gas in which Ar is added to $CF_4$ is employed as the etching gas for the first interlayer insulating film 10, the second interlayer insulating film 18, and the cover film 9. In this case, the contact holes 18c formed on the lower electrodes 11a of the capacitor are not depicted in the sectional views but indicated by forming positions in FIG. 7I.

Then, a titanium (Ti) film of 20 nm thickness and a titanium nitride (TiN) film of 50 nm thickness are formed on the second interlayer insulating film 18 and inner surfaces of the contact holes 18a, 18b, 18c by the sputtering method, and these films are used as an adhesive layer. Then, a tungsten film is formed on the adhesive layer by the CVD method using a mixed gas consisting of a tungsten fluoride (WF$_6$) gas, argon, hydrogen. The contact holes 18a, 18b, 18c are buried completely by this tungsten film.

Then, the titanium film and the adhesive layer on the second interlayer insulating film 18 are removed by the CMP method to be left only in the contact holes 18a, 18b, 18c. Accordingly, the titanium film and the adhesive layer in the contact holes 18a, 18b, 18c are employed as conductive plugs 19a, 19b.

Here, in one p-well 3 in the memory cell region, the first conductive plug 19b on the central n-type impurity diffusion region 6b put between two gate electrodes 5a, 5b is connected electrically to the bit line described later, and two second conductive plugs 19a on both sides is connected to the upper electrodes 13a of the capacitor via the wiring described later. In addition, the contact holes 18c on the lower electrodes 11a of the capacitor and the conductive plugs (not shown) in the contact holes 18c are formed on portions that are protruded from the top end of the dielectric film.

Then, the second interlayer insulating film 18 is heated in the vacuum chamber at the temperature of 390° C. to discharge the moisture to the outside.

Next, steps required to form a structure shown in FIG. 5K will be explained hereunder.

First, an SiON film of 100 nm thickness, for example, is formed on the second interlayer insulating film 18 and the conductive plugs 19a, 19b as an oxidation preventing film 20 by the plasma CVD method. This SiON film is formed by using a mixed gas consisting of silane (SiH$_4$) and N$_2$O.

Then, contact holes 20a are formed on the upper electrodes 13a of the capacitor by patterning the encap layer 17, the second interlayer insulating film 18 and the oxidation preventing film 20 by virtue of the photolithography method.

After this, the film quality of the dielectric film 12a of the capacitor is improved by annealing the dielectric film 12a of the capacitor at 550° C. for 60 minutes in the oxygen atmosphere. In this case, the oxidation of the conductive plugs 19a, 19b can be prevented by the oxidation preventing film 20.

Next, steps required to form a structure shown in FIG. 5L will be explained hereunder.

First, the oxidation preventing film 20 is removed by the dry etching using the CF gas.

Then, respective surfaces of the conductive plugs 19a, 19b and the upper electrodes 13a of the capacitor are etched by about 10 nm by the RF etching method to expose clean surfaces. Then, a conductive film having a quadruple-layered structure containing aluminum is formed on the second interlayer insulating film 18, the conductive plugs 19a, 19b, and the contact holes 20a by the sputter method. The conductive film consists of a titanium nitride film of 50 nm thickness, a copper-containing (0.5%) aluminum film of 500 nm thickness, a titanium film of 5 nm thickness, and a titanium nitride film of 100 nm thickness from the bottom.

Then, the conductive film having the multi-layered structure is patterned by the photolithography method to form via contact pads 21b on the conductive plugs 19b in the center of the p-well 3 and also form wirings 21a each having a shape that connects an upper surface of the conductive plug 19a on both sides and an upper surface of the upper electrode 13a of the capacitor. Accordingly, the upper electrode 13a of the capacitor is connected to the n-type impurity diffusion region 6a near both sides of the p-well 3 via the wiring 21a, the conductive plug 19a and the refractory metal silicide layer 8a. In this case, another wiring (not shown) is also formed on the conductive plug (not shown) formed on the lower electrodes 11a of the capacitor.

Then, an SiO$_2$ film of 2300 nm thickness is formed as a third interlayer insulating film 22 by the plasma CVD method using TEOS as the source. Thus, the second interlayer insulating film 18, the wirings 21a, the contact pad 21b, etc. are covered with the third interlayer insulating film 22. Subsequently a surface of the third interlayer insulating film 22 is made flat by the CMP method.

Then, a protection insulating film 23 made of SiO$_2$ is formed on the third interlayer insulating film 22 by the plasma CVD method using TEOS. Then, a contact hole 22a is formed on the contact pad 21b positioned over the center of the p-well 3 in the memory cell region by patterning the third interlayer insulating film 22 and the protection insulating film 23.

Then, an adhesive layer 24 made of titanium nitride (TiN) and having a thickness of 90 to 150 nm is formed on an upper surface of the protection insulating film 23 and an inner surface of the contact hole 22a by the sputter method. Then, a blanket tungsten film 25 is formed by the CVD method to fill the contact hole 22a.

Then, the blanket tungsten film 25 is etched back to leave only in the contact hole 22a. This blanket tungsten film 25 left in the contact hole 22a is used as the second layer conductive plug.

Then, a metal film is formed on the adhesive layer 24 and the blanket tungsten film 25 by the sputter method. Then, a bit line 26 that is connected electrically to the n-type impurity diffusion region 6b via the second layer conductive plug (25), the contact pad 21a, the first layer conductive plug 20b, and the refractory metal silicide layer 8b is formed by patterning the metal film by means of the photolithography method.

In this first embodiment, since the second resist patterns 15 or the third resist patterns 16 are retreated from the side in the middle of the etching of the ferroelectric film 12 or the first conductive film 11, both side shoulder portions of the upper electrodes 13a of the capacitor are exposed and partially etched. However, since the exposed portions function as an etching mask of the ferroelectric film 12 and the first conductive film 11, the patterning of the ferroelectric film 12 and the first conductive film 11 can be carried out fairly. Accordingly, the side surfaces of the upper electrodes 13a of the capacitor, the side surfaces of the dielectric films 12a of the capacitor, and the side surfaces of the lower electrodes 11a of the capacitor are positioned on the substantially same plane.

In this case, the upper electrodes 13a of the capacitor must be left to have a thickness the suitable masking property as the upper electrodes 13a of the capacitor at a point of time when the formation of the ferroelectric capacitor Q is finished. A selective etching ratio of the upper electrodes 13a of the capacitor to the ferroelectric film 12 or the first conductive film 11 is set low by optimizing the material and the thickness of the upper electrodes 13a of the capacitor and the etching conditions to cause the upper electrodes 13a of the capacitor to have the masking property sufficiently.

It is not quite enough that the upper electrodes 13a of the capacitor remaining at a point of time when the formation of the ferroelectric capacitor Q is finished are merely left. Not only the essential change in the pattern shape of the upper electrodes 13a of the capacitor is not caused, but also the thickness that is enough to act as the upper electrodes 13a of the capacitor must be assured. As described above, the thickness not to change the crystalline state close to the boundary between the ferroelectric film 12 and the upper electrodes 13a of the capacitor is needed. Finally the thickness of more than 20 nm must be left. However, this lower limit value of the thickness corresponds to the case where PZT is employed as the ferroelectric film 12 and the iridium oxide film is employed as the upper electrode 13a of the capacitor.

Figure 3A:
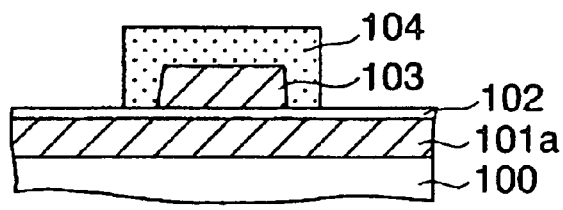
FIGS. 3A to 3C are sectional views showing second capacitor forming steps in the prior art.
Figure 3B:
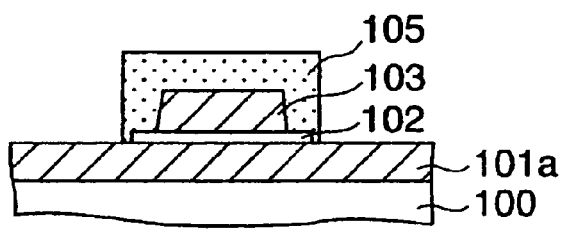
Figure 3C:
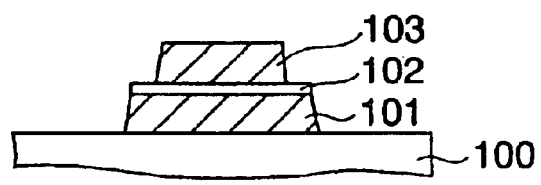
Figure 4:
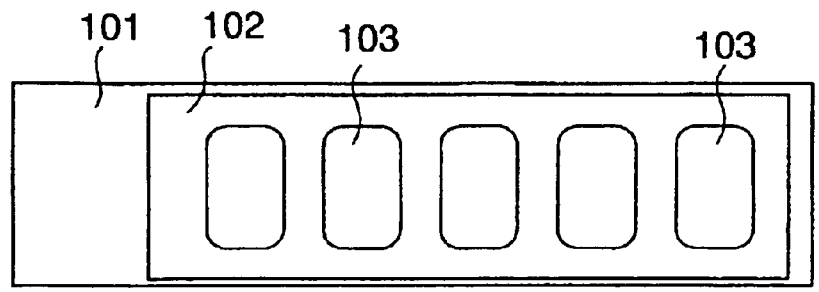
FIG. 4 is a plan view showing a shape of a capacitor formed by the second capacitor forming steps.
Figure 8:
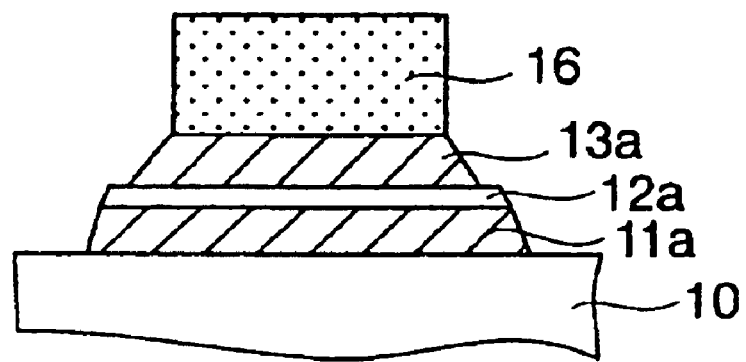
FIG. 8 is a sectional view showing the state that side portions of an upper electrode constituting a capacitor of the memory cell of the semiconductor device are retreated.

If the function of the upper electrodes 13a of the capacitor as the mask lacks, the side portions of the resist patterns 15, 16 are retreated, as shown in FIG. 8, and therefore exposed portions of the upper electrodes 13a of the capacitor are etched to then expose the ferroelectric film 12. As a result, the shape of the upper electrodes 13a of the capacitor becomes substantially equal to the planar shape shown in FIG. 4. Thus, it is impossible to reduce the capacitance of the ferroelectric capacitor Q or to achieve the higher density of the capacitors.

Therefore, if the material of the upper electrodes 13a of the capacitor has the low masking property, such low masking property can be dealt with by forming a film that is formed of the masking material having the high selective etching property to the ferroelectric film 12 and the first conductive film 11, e.g., an SRO (strontium ruthenium oxide) film on the second conductive film 13, or shortening an etching time by reducing previously the thicknesses of the ferroelectric film 12 and the first conductive film 11, or increasing the thickness of the upper electrodes 13a of the capacitor.

Figure 9:
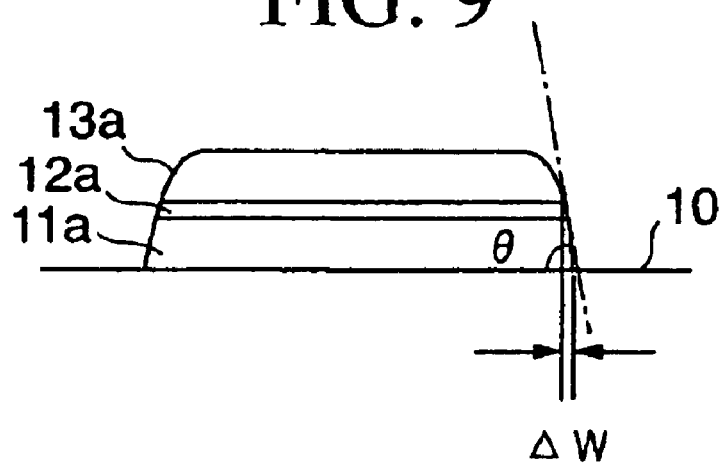
FIG. 9 is a sectional view showing a taper shape of a side surface of the upper electrode, a dielectric film, and a lower electrode constituting the capacitor of the semiconductor device according to the first embodiment of the present invention.

In the meanwhile, sectional shapes derived when the ferroelectric film 12 and the first conductive film 11 are etched by using the upper electrodes 13a of the capacitor as a mask are shown in FIG. 9. An expansion $\Delta W$ of a width of the bottom portion of the lower electrode 11a of the capacitor from a width of the bottom portion of the upper electrode 13a of the capacitor on one side can be expressed by Eq. (1). Where $T_{ferro}$ is a thickness of the ferroelectric film, $T_{be}$ is a thickness of the lower electrode of the capacitor, and $\theta$ is a taper angle of a line connecting a side edge of the bottom portion of the upper electrode of the capacitor and a side edge of the bottom portion of the lower electrode of the capacitor.

$$\Delta W = (T_{ferro} + T_{be})/\tan\theta \quad (1)$$

$\Delta W$ may be reduced to miniaturize according to the present technology, and there is no necessity that the width of the upper electrode of the capacitor should be reduced by the alignment margin needed in the photolithography. As explained in the prior art column, if the conductive by-product generated in the etching is adhered onto the side walls of the resist, the short circuit between the upper electrode of the capacitor and the lower electrode of the capacitor is caused.

Therefore, if the resist patterns 15, 16 are retreated appropriately in the lateral direction as in the present first embodiment, the etching can be carried out while always cutting the conductive by-product adhered onto the side walls of the resist patterns 15, 16. However, if the resist patterns 15, 16 are retreated excessively, the exposure of the upper electrode 13a of the capacitor is increased and thus the width and the thickness the upper electrode 13a of the capacitor cannot be assured sufficiently after the formation of the capacitor is finished.

Figure 10:
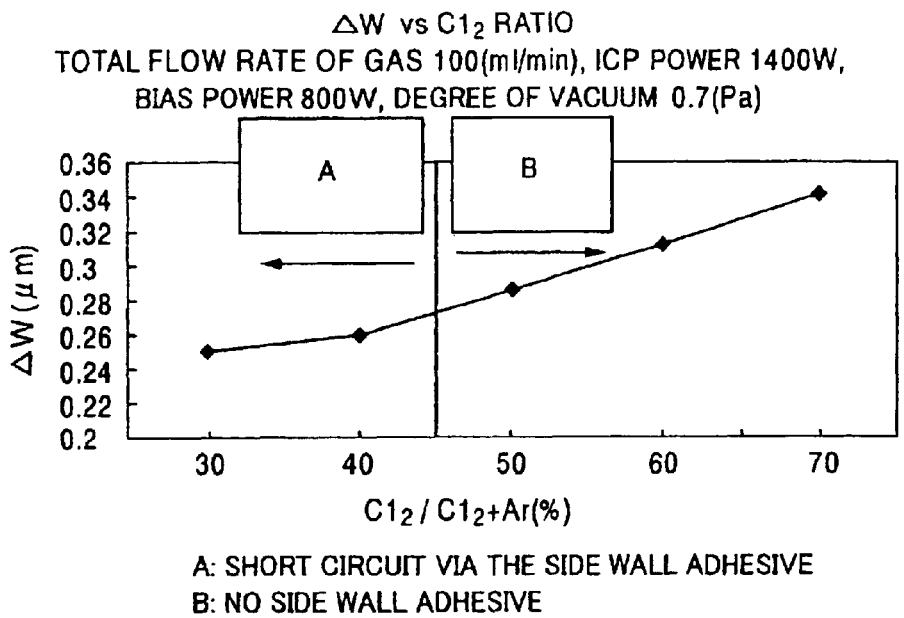
FIG. 10 is a view showing a relationship between a chlorine ratio and a difference ΔW in a bottom surface width of the upper and lower electrodes in the etching of a first conductive film as the lower electrode in order to form the capacitor of the semiconductor device according to the first embodiment of the present invention.

FIG. 10 shows a relationship between $\Delta W$ and the by-product adhesion by changing a gas ratio of chlorine and argon to adjust the amount of retreat of the side portion of the resist pattern 16, in the steps of forming the lower electrodes 11a of the capacitor by etching the first conductive film 11 made of platinum by virtue of the plasma reactive ion etching using the mixed gas of chlorine and argon while using the resist patterns 16.

The etching equipment in which the inductive coupling plasma generating source is employed as the plasma source and a low frequency bias power of 400 kHz is applied to the semiconductor substrate side is employed. Also, the resist patterns 16 are subjected to the hardening by the ultraviolet (UV) cure to assure the heat resistance.

Figure 11A:
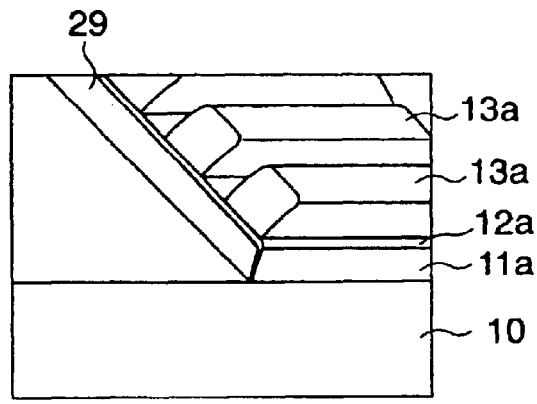
FIG. 11A is a perspective view showing the state that by-product is adhered onto the side surface of the capacitor after the etching of the first conductive film serving as the lower electrode is finished.
Figure 11B:
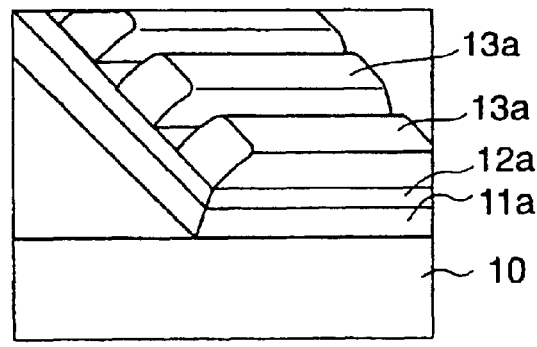
FIG. 11B is a perspective view showing the state that the by-product is not adhered onto the side surface of the capacitor after the etching of the first conductive film serving as the lower electrode is finished.

As shown in FIG. 10, if a retreating speed of the side portion of the resist pattern 16 is decreased by lowering the chlorine ($Cl_2$) ratio, $\Delta W$ can be reduced. In this case, the short circuit due to the adhesion of the etching product 29 onto the side wall, as shown in FIG. 11A, is generated when the $Cl_2$ ratio becomes lower than 40 to 50%. When the margin for the short circuit is taken account of, it was found that, if the etching is executed at the $Cl_2$ ratio of about 60%, the retreating speed of the resist patterns 16 becomes optimum and also the adhesion of the etching product 29 onto the side wall is not generated, as shown in FIG. 11B, although $\Delta W$ is a little large.

In the etching of the ferroelectric film 12, especially the etching of the oxygen-containing dielectric film such as PZT, PLZT, etc., the retreating speed of the resist patterns becomes quick even at the same chlorine ratio since the oxygen is supplied during the etching. Even if the $Cl_2$ ratio is lowered considerably, the short circuit due to the adhesion of the etching product 29 is hard to occur rather than the case where the film not-containing the oxygen, e.g., the first conductive film 11 made of platinum is etched. In the experiment, no adhesion of the etching product 29 was found when the $Cl_2$ ratio in the etching of the PZT film is lowered up to 12.5%.

However, when the first conductive film 11 is exposed after the etching of the PZT ferroelectric film 12 is finished, the effect for preventing the adhesion of the etching product onto the side walls by the oxygen is eliminated, so that the etching product 29 generated by the etching of the first conductive film 11 adheres onto the side walls of the dielectric films 12a of the capacitor and the upper electrode 13a of the capacitor. As the countermeasure to this, if the etching conditions are switched to enhance the retreating speed of the resist patterns 15 when the first conductive film 11 is exposed, the adhesion of the etching product 29 onto the side walls can be suppressed.

The reason for that the adhesion of the etching product onto the side walls, caused by the retreat of the resist pattern, can be prevented is that the etching product is ready to adhere onto the side walls of the resist patterns and thus such influence appears on the lower side walls. Thus, the etching product is difficult to adhere onto the side surfaces of the capacitor by separating the side surfaces of the resist pattern from the side surfaces of the capacitor.

As an example of the etching conditions of the ferroelectric film 12, as the first step, a total flow rate of the chlorine gas and the argon gas is set to 50 to 100 ml/min, the chlorine ratio is set to 15 to 25%, the bias power is set to 200 to 1000 W (400 kHz), and a degree of vacuum of the etching atmosphere is set to 0.5 to 0.9 Pa. Then, as the second atep, the total flow rate of the chlorine gas and the argon gas is set to 50 to 100 ml/min, the chlorine ratio is set to 60 to 90%, the bias power is set to 200 to 1000 W (400 kHz), and a degree of vacuum of the etching atmosphere is set to 0.5 to 0.9 Pa. Also, as the preferable the etching conditions of the first conductive film 11, the total flow rate of the chlorine gas and the argon gas is set to 50 to 100 ml/min, the chlorine ratio is set to 50 to 70%, the bias power is set to 200 to 1000 W (400 kHz), and a degree of vacuum of the etching atmosphere is set to 0.5 to 0.9 Pa.

By the way, if the masking property is insufficient to assure the thickness of the upper electrodes 13a of the capacitor, such lack can be overcome by covering the masking material having the good selectivity on the upper electrodes 13a of the capacitor, or shortening the etching time by reducing the thicknesses of the dielectric films 12a of the capacitor and the lower electrodes 11a of the capacitor, or increasing the thickness of the upper electrodes 13a of the capacitor.

Figure 12A:
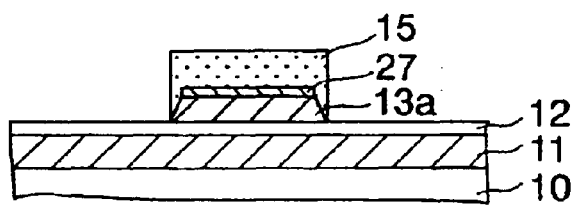
FIGS. 12A to 12C are sectional views showing steps of forming the capacitor when a film having a high selective etching property is formed on the upper electrode constituting the capacitor of the semiconductor device according to the first embodiment of the present invention.
Figure 12B:
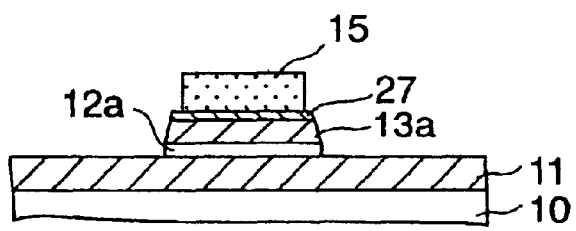

For example, as shown in FIG. 12A, the SRO (strontium ruthenium oxide) film 27 having the high selectivity to the ferroelectric film 12 or the first conductive film 11 is formed on a part of the upper electrodes 13a of the capacitor, and then the stripe-like second resist patterns 15 passing over the upper electrodes 13a of the capacitor are formed on the ferroelectric film 12. Then, as shown in FIGS. 12B and 22C, the dielectric films 12a of the capacitor are formed by etching the ferroelectric film 12 while using the second resist patterns 15 as a mask, and then the lower electrodes 11a of the capacitor are formed by patterning the first conductive film 11.

Since such patterning method is applied, the retreat of the upper electrodes 13a of the capacitor in the ferroelectric film 12 and the first conductive film 11 can be suppressed, and also the thinning of the upper electrodes 13a of the capacitor can be suppressed considerably. In this case, in FIGS. 12A to 12C, the SRO film 27 is formed on a part of the upper electrodes 13a of the capacitor, but such SRO film 27 may be formed on the overall surface of the upper electrodes 13a of the capacitor. The patterning of the SRO film 27 may be executed separately with that of the upper electrodes 13a of the capacitor, or continuously to that of the upper electrodes 13a of the capacitor.

Figure 13A:
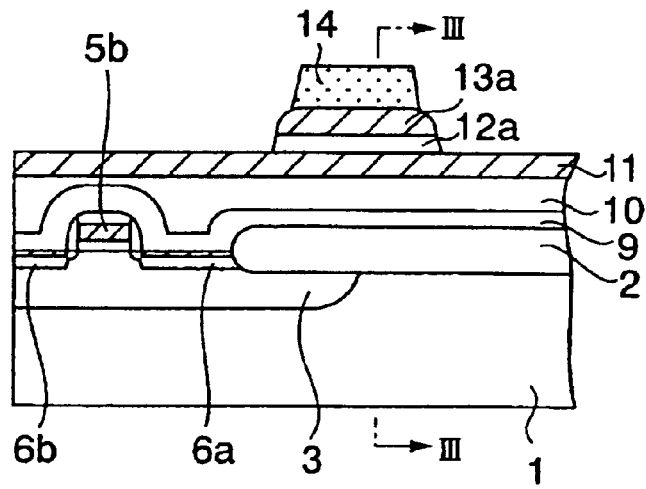
FIG. 13A is a sectional view showing the case where the upper electrode and the dielectric film constituting the capacitor of the semiconductor device according to the first embodiment of the present invention are formed by the same resist pattern.
Figure 13B:
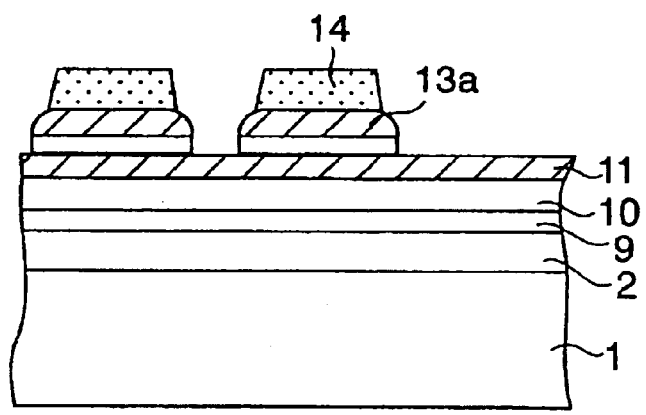
FIG. 13B is a sectional view taken along a III—III line in FIG. 13A.
Figure 13C:
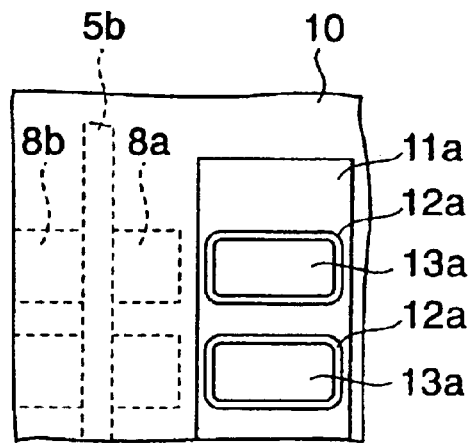
FIG. 13C is a plan view of the case.

The first resist patterns 14 and the second resist patterns 15, that have a different shape respectively, are employed in the patterning of the second conductive film 13 and the patterning of the ferroelectric film 12. However, as shown in FIG. 13A, the second conductive film 13 and the ferroelectric film 12 may be continuously patterned by employing the first resist patterns 14. In the upper electrodes 13a of the capacitor formed as above, not only upper portions located on both sides are etched as shown in FIG. 13A, but also upper portions located on both sides in the extended direction of the gate electrode 5b are etched as shown in FIG. 13B. Also, as shown in FIG. 13C, a planar shape of the dielectric film 12a of the capacitor is not formed like the stripe shape but formed in the similar shape to the planar shape of the upper electrode 13a of the capacitor.

(Second Embodiment)

Figure 14A:
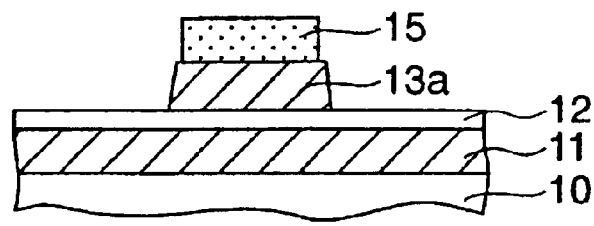
FIGS. 14A and 14B are sectional views showing the etching step applied to form the capacitor of the semiconductor device according to a second embodiment of the present invention.
Figure 14B:
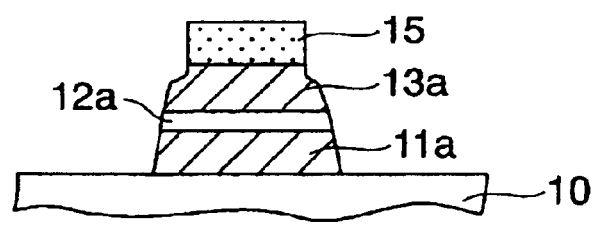
Figure 15A:
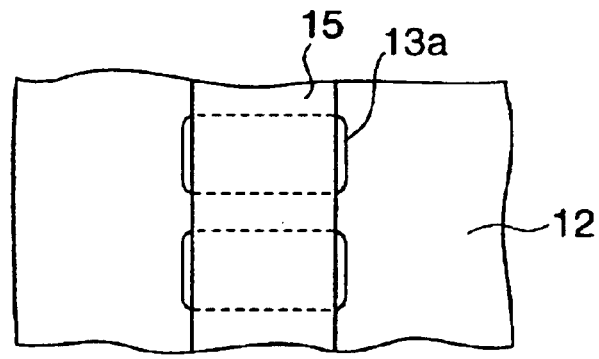
FIGS. 15A and 15B are plan views showing the etching step applied to form the capacitor of the semiconductor device according to the second embodiment of the present invention.
Figure 15B:
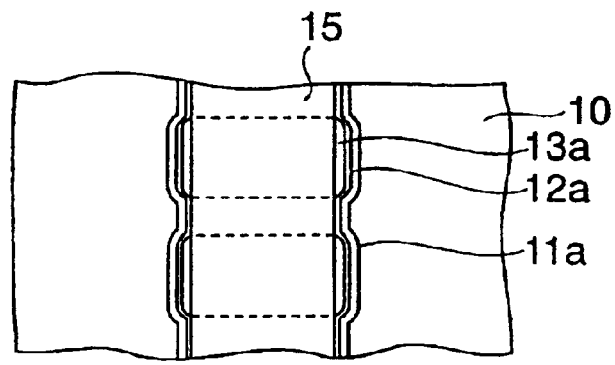

FIGS. 14A and 14B are sectional views showing steps of etching continuously the ferroelectric film 12 and the first conductive film 11 by using the second resist patterns 15, and FIGS. 15A and 15B are their plan views.

First, as shown in FIG. 14A and FIG. 15A, in order to leave the sufficient upper electrodes 13a of the capacitor at a point of time when the formation of the capacitor is completed even if the upper electrodes 13a of the capacitor are exposed from the beginning of the etching of the ferroelectric film 12 and the first conductive film 11, the first conductive film 13 constituting the upper electrodes 13a of the capacitor is formed thick from the beginning of the film formation.

Then, the stripe-like second resist patterns 15 passing over the upper electrodes 13a of the capacitor are formed on the ferroelectric film 12. In this case, assume the state that a part of upper surfaces of the upper electrodes 13a of the capacitor is exposed on the sides of the second resist patterns 15.

Then, as shown in FIG. 14B and FIG. 15B, the dielectric films 12a of the capacitor and the lower electrodes 11a of the capacitor are formed by etching the ferroelectric film 12 and the first conductive film 11 while using the second resist patterns 15 as a mask. A part of upper layers of the upper electrodes 13a of the capacitor on both sides is lost after the etching is finished, but the thickness enough to function as the upper electrodes 13a of the capacitor still remains.

As a result, even if the displacement of the second resist patterns 15 to the upper electrodes 13a of the capacitor occurs at the time of etching of the ferroelectric film 12 and the first conductive film 11, the original areas of the upper electrodes 13a of the capacitor can be assured after the ferroelectric film 12 and the first conductive film 11 are etched. Accordingly, as shown in a plan view in FIG. 15B, shapes of the dielectric films 12a of the capacitor and the lower electrodes 11a of the capacitor formed by patterning the ferroelectric film 12 and the first conductive film 11 are formed to reflect the shapes of the upper electrodes 13a of the capacitor on their side portions, but their lower widths are retreated between the upper electrodes 13a of the capacitor to narrow.

In this case, respective thicknesses of the upper electrode 13a of the capacitor, the ferroelectric film 12 (the dielectric film 12a of the capacitor), and the first conductive film 11 (the lower electrode 11a of the capacitor) have a relationship given by Inequality (2). Where $T_{te}$ is the thickness of the upper electrode of the capacitor, $T_{ferro}$ is the thickness of the ferroelectric film, $T_{be}$ is the thickness of the lower electrode of the capacitor, $ER_{te}$ is the etching rate of the upper electrode of the capacitor, $ER_{ferro}$ is the etching rate of the ferroelectric film of the capacitor, and $ER_{be}$ is the etching rate of the lower electrode of the capacitor.

$$T_{te} > (T_{ferro} \times ER_{te}/ER_{ferro} + T_{be} \times ER_{te}/ER_{be}) \quad (2)$$

For example, in case the thickness of the ferroelectric film 12 made of PZT is set to 100 nm, the thickness of the first conductive film 11 made of platinum is set to 100 nm, the etching rate of the ferroelectric film 12 is set to 200 nm/min, the etching rate of the first conductive film 11 is set to 400 nm/min, and the etching rate of the upper electrode 13a, made of the iridium oxide film, of the capacitor is set to 400 nm/min, the upper electrodes 13a of the capacitor must be formed to have a thickness of more than 300 nm.

Figure 12C:
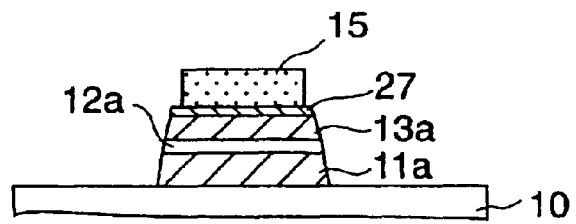

If the thickness of the upper electrode 13a of the capacitor should be suppressed, the ferroelectric film 12 and the lower electrode film 11 of the capacitor may be set thin previously, otherwise the masking material having the high selectivity, e.g., SRO, may be coated on the upper electrodes 13a of the capacitor, as shown in FIGS. 12A to 12C.

(Third Embodiment)

Figure 16A:
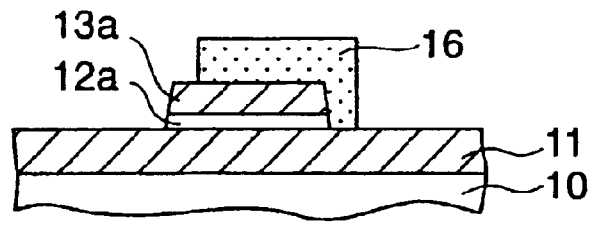
FIGS. 16A and 16B are sectional views showing the steps of forming the dielectric film and the lower electrode when displacement of the resist pattern occurs in the etching step applied to form the capacitor of the semiconductor device.
Figure 16B:
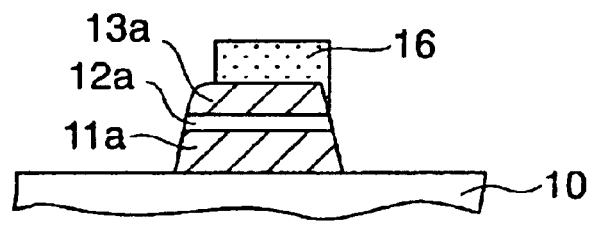

As shown in FIG. 16A, if the third resist pattern 16 is displaced from the upper surface of the upper electrode 13a of the capacitor to expose a part of the upper electrode 13a of the capacitor from the beginning, the upper electrode 13a of the capacitor is also etched at a point of time when the etching of the first conductive film 11 is finished. Thus, as shown in FIG. 16B, an area of the upper electrode 13a of the capacitor is reduced.

Figure 17A:
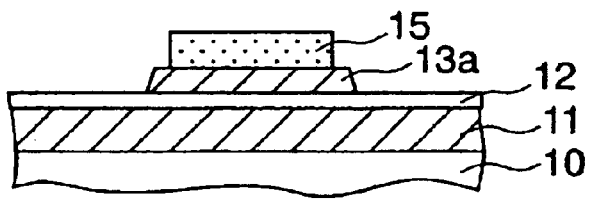
FIGS. 17A and 17B are sectional views showing the etching step applied to form a capacitor of a semiconductor device according to a third embodiment of the present invention.
Figure 17B:
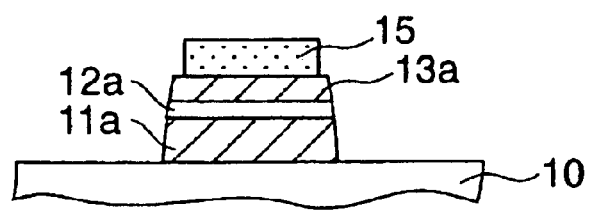
Figure 18A:
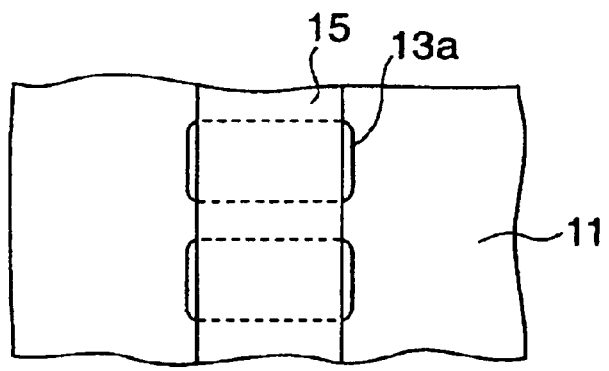
FIGS. 18A and 18B are plan views showing the etching step applied to form the capacitor of the semiconductor device according to the third embodiment of the present invention.
Figure 18B:
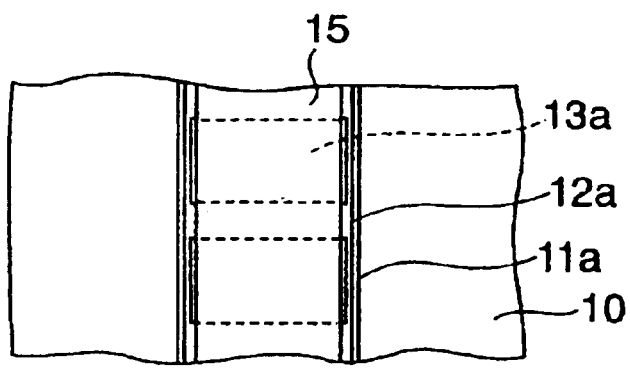

Therefore, as shown in FIGS. 17A and 18A, the width of the resist pattern 15 is formed smaller by the displacement precision or more when the ferroelectric film 12 and the lower electrode film 11 are etched.

In this case, the thickness of the upper electrode 13a of the capacitor is set such that the protruded portion of the upper electrode 13a of the capacitor from the resist pattern 16 is deleted after the formation of the capacitor is finished and then the planar surface of the upper electrode 13a of the capacitor is formed as a rectangle. For this reason, as shown in FIGS. 27B and 28B, even if the resist pattern 15 is displaced from the pattern of the upper electrode 13a of the capacitor, the final width of the upper electrode 13a of the capacitor is decided based on the pattern width of the lower electrode 11a of the capacitor, so that variation of the area of the upper electrode 13a of the capacitor can be suppressed.

In this technology, the ferroelectric film 12 and the lower electrode film 11 must be worked by using the one layer mask, and thus the working must be made by using the two layer masks in total. The thicknesses of respective layers have a relationship given by Inequality (3) when the ferroelectric film 12 and the lower electrode film 11 are worked by using the one-layer resist pattern 15 after the upper electrode 13a of the capacitor is worked by using the one-layer pattern 14, for example.

Where $T_{te}$ is the thickness of the upper electrode of the capacitor, $T_{ferro}$ is the thickness of the ferroelectric film, $T_{be}$ is the thickness of the lower electrode of the capacitor, $ER_{te}$ is the etching rate of the upper electrode of the capacitor, $ER_{ferro}$ is the etching rate of the ferroelectric film of the capacitor, and $ER_{be}$ is the etching rate of the lower electrode of the capacitor.

$$T_{te} < (T_{ferro} \times ER_{te}/ER_{ferro} + T_{be} \times ER_{te}/ER_{be}) \quad (3)$$

For example, in case the thickness of the PZT ferroelectric film 12 is set to 200 nm, the thickness of the first conductive film 11 made of platinum is set to 200 nm, the etching rate of the PZT ferroelectric film 12 is set to 200 nm/min, the etching rate of the first conductive film 11 is set to 400 nm/min, and the etching rate of the upper electrode 13a, made of the iridium oxide film, of the capacitor is set to 400 nm/min, the thickness of the upper electrodes 13a of the capacitor must be set below 600 nm.

As shown in FIGS. 13A to 13C, even if the upper electrodes 13a of the capacitor and the dielectric films 12a of the capacitor are formed by using the same resist pattern, variation of the upper electrodes 13a of the capacitor can be suppressed. In this case, because the lower electrodes 11a of the capacitor are formed by using another resist pattern, two sheets of resist patterns are employed in total to form the ferroelectric capacitor Q. The final width of the upper electrodes 13a of the capacitor is decided based on the pattern width of the dielectric film 12a of the capacitor, and thus variation of the area of the upper electrode 13a of the capacitor can be suppressed.

(Fourth Embodiment)

For the reason of the lithography technology, it is difficult to reproduce faithfully corner portions of the first resist pattern 14, that is used to form the upper electrodes 13a of the capacitor, on the reticle. Thus, as shown in FIG. 7C, such corner portions of the first resist pattern 14 are slightly rounded.

With the progress of the miniaturization of the device, it is impossible to disregard loss of the area of the upper electrodes 13a of the capacitor because of generation of the rounded corner portions.

Therefore, a following method will be employed not worsen the cell efficiency.

Figure 19A:
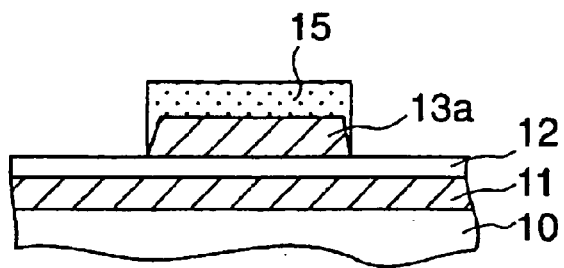
FIGS. 19A and 19B are sectional views showing the etching step applied to form a capacitor of a semiconductor device according to a fourth embodiment of the present invention.
Figure 19B:
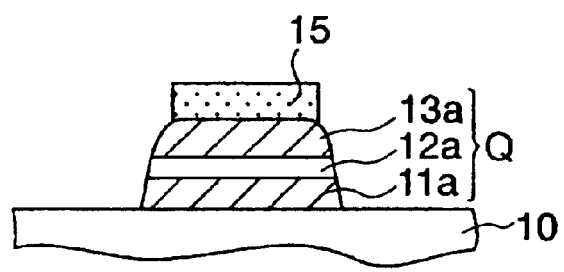
Figure 20A:
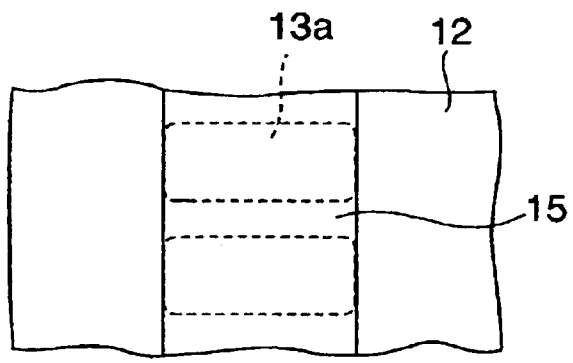
FIGS. 20A and 20B are plan views showing the etching step applied to form the capacitor of the semiconductor device according to the fourth embodiment of the present invention.
Figure 20B:
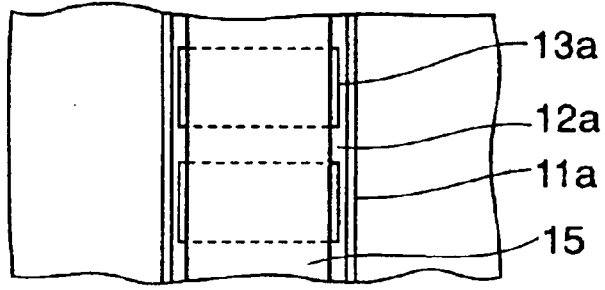

First, as shown in FIG. 19A and FIG. 20A, the upper electrode 13a of the capacitor is formed, and then the stripe-like second resist pattern 15 passing over the upper electrode 13a of the capacitor is formed on the ferroelectric film 12. Then, as shown in FIG. 19B and FIG. 20B, the dielectric film 12a of the capacitor and the lower electrode 11a of the capacitor are formed by etching the ferroelectric film 12 and the first conductive film 11 while employing the second resist pattern 15 as a mask.

At this etching, side portions of the second resist pattern 15 are retreated like the first embodiment, but the side portions of the upper electrode 13a of the capacitor are etched together with the ferroelectric film 12 and the first conductive film 11.

In other words, the side portions of the upper electrode 13a of the capacitor are etched under the conditions that such side portions of the upper electrode 13a can be retreated up to the width, which is equal to or smaller than the width between the rounded corner portions of the upper electrode 13a of the capacitor, at a point of time when the etching of the ferroelectric film 12 and the first conductive film 11 is finished.

Accordingly, after the formation of the ferroelectric capacitor Q is finished, the rounded corner portions of the upper electrode 13a of the capacitor are deleted and the side profile is transferred onto the dielectric film 12a of the capacitor and the lower electrode 11a of the capacitor. This portion overlaps with taper portions of the dielectric film 12a of the capacitor and the lower electrode 11a of the capacitor. Consequently, the planar shape of the upper electrode 13a of the capacitor becomes a rectangular shape not to contain the rounded corner portion.

The thicknesses of respective films at this time has a relationship given by following Inequality (4).

Where $T_{te}$ is the thickness of the upper electrode of the capacitor, $T_{ferro}$ is the thickness of the ferroelectric film, $T_{be}$ is the thickness of the lower electrode of the capacitor, $ER_{te}$ is the etching rate of the upper electrode of the capacitor, $ER_{ferro}$ is the etching rate of the ferroelectric film of the capacitor, and $ER_{be}$ is the etching rate of the lower electrode of the capacitor.

$$T_{te} < (T_{ferro} \times ER_{te}/ER_{ferro} + T_{be} \times ER_{te}/ER_{be}) \quad (4)$$

For example, in case the thickness of the PZT ferroelectric film 12 is set to 200 nm, the thickness of the first conductive film 11 made of platinum is set to 200 nm, the etching rate of the PZT ferroelectric film 12 is set to 200 nm/min, the etching rate of the first conductive film 11 is set to 400 nm/min, and the etching rate of the upper electrode 13a, made of the iridium oxide film, of the capacitor is set to 400 nm/min, the thickness of the upper electrodes 13a of the capacitor must be set below 600 mm.

In the above embodiments, FeRAM is explained. The present invention may be similarly applied to the formation of the capacitor of the DRAM. In this case, the high dielectric material such as (BaSr)TiO$_3$ (BST), strontium titanate (STO), etc. is used in place of the above ferroelectric material.

As described above, according to the present invention, if the dielectric film and the lower electrode constituting the capacitor are formed by the etching, both sides of the upper electrode are exposed by retreating the side portions of the resist pattern during the etching, then the upper electrode and the resist pattern are used as the etching mask, and then the planar shape of the upper electrode is seldom changed at a point of time when the etching of the film serving as the dielectric film or the lower electrode is finished. Therefore, since the conductive etching product generated on the side portions of the resist pattern is not adhered onto the side surfaces of the capacitor, the short circuit between the upper electrode and the lower electrode due to the etching product can be prevented in advance, and also the improvement of the cell efficiency can be achieved by suppressing the reduction in the width of the upper electrode from the width of the lower electrode to the lowest minimum.

Also, according to the present invention, not only the retreat of the resist pattern but also the retreat of the upper electrode is executed when the dielectric film or the lower electrode film is etched. Therefore, the reduction in the capacitor area due to the rounded corners of the resist pattern can be suppressed.

In addition, according to the present invention, when the dielectric film or the lower electrode film is etched, both sides of the upper electrode are exposed from the resist pattern and both sides of the upper electrode are removed by the exposed length. Therefore, variation in the area of the upper electrode due to the displacement of the resist pattern can be suppressed.

What is claimed is:

1. A manufacturing method of a semiconductor device comprising the steps of:

forming sequentially a first conductive film, a dielectric film, and a second conductive film, that constitute a capacitor, on an insulating film formed over a semiconductor substrate;

forming a first resist pattern on the second conductive film;

forming an upper electrode of the capacitor by etching the second conductive film while using the first resist pattern as a mask;

removing the first resist pattern;

forming a second resist pattern, that have a width equal to or smaller than a pattern width of the upper electrode of the capacitor, on the upper electrode of the capacitor; and etching at least one of the dielectric film and the first conductive film by using the second resist pattern as a mask, while exposing a part of an upper surface of the upper electrode of the capacitor by retreating side portion of the second resist pattern.

2. A manufacturing method of a semiconductor device according to claim 1, further comprising the steps of:

forming the upper electrode in plural at a distance in one direction;

forming the second resist pattern into stripe shapes to pass over the upper electrodes;

forming a stripe-like dielectric film of the capacitor under the upper electrodes by etching the dielectric film while using the second resist pattern as a mask; and forming a stripe-like lower electrode of the capacitor under the stripe-like dielectric film by etching the first conductive film while using the second resist pattern as a mask.

3. A manufacturing method of a semiconductor device according to claim 2, wherein the stripe-like dielectric film and the stripe-like lower electrode are formed narrow between the upper electrodes.

4. A manufacturing method of a semiconductor device according to claim 1, further comprising the steps of:

patterning the dielectric film for the capacitor by etching while using the second resist pattern as a mask, and then removing the second resist pattern;

forming a third resist pattern, that has a width equal to or smaller than a pattern width of the upper electrode of the capacitor, on the upper electrode of the capacitor and the dielectric film of the capacitor; and forming the lower electrode of the capacitor by etching the first conductive film while using the third resist pattern as a mask, while exposing a part of an upper surface of the upper electrode of the capacitor by retreating side portion of the third resist pattern.

5. A manufacturing method of a semiconductor device according to claim 1, further comprising the steps of:

patterning the dielectric film having a planar shape, that is similar to a planar shape of the upper electrode of the capacitor, by etching the dielectric film while using the first resist pattern as a mask after the upper electrodes of the capacitor are formed; and forming the lower electrode of the capacitor by etching the first conductive film while using the second resist patterns as a mask.

6. A manufacturing method of a semiconductor device according to claim 1, wherein adhesion of conductive etching product onto side wall of the upper electrode of the capacitor and the lower electrode of the capacitor is prevented during etching of the dielectric film or the first conductive film by adjusting a chlorine ratio, a total gas flow rate, a bias power, or a degree of vacuum while using a plasma containing chlorine and argon to control a retreating speed of the resist pattern.

7. A manufacturing method of a semiconductor device according to claim 1, wherein respective thicknesses of the first conductive film, the dielectric film, and the second conductive film are set such that an original width of the upper electrode of the capacitor is assured at a time when the etching of the dielectric film and the first conductive film is finished.

8. A manufacturing method of a semiconductor device according to claim 1, wherein side portions of the upper electrode of the capacitor are retreated during the etching of the dielectric film or the first conductive film, and an amount of retreat is set to exceed an amount of displacement of the upper electrode of the capacitor from the pattern when the second resist patterns or the third resist pattern is formed.

9. A manufacturing method of a semiconductor device according to claim 1, wherein side portions of the upper electrode of the capacitor are retreated during the etching of the dielectric film or the first conductive film, and an amount of retreat is set to exceed a width that is required to remove corner portions of the pattern of the upper electrode of the capacitor.

10. A manufacturing method of a semiconductor device according to claim 1, further comprising the step of:

forming an etching preventing film, that prevents the etching of the upper electrode of the capacitor during the etching of the dielectric film or the first conductive film, on the upper electrode of the capacitor.

11. A manufacturing method of a semiconductor device according to claim 10, wherein the etching preventing film is formed of strontium ruthenium oxide.

* * * * *